United States Patent
Matsubayashi

(10) Patent No.: US 8,537,600 B2
(45) Date of Patent: Sep. 17, 2013

(54) LOW OFF-STATE LEAKAGE CURRENT SEMICONDUCTOR MEMORY DEVICE

(75) Inventor: Daisuke Matsubayashi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 230 days.

(21) Appl. No.: 13/191,934

(22) Filed: Jul. 27, 2011

(65) Prior Publication Data

US 2012/0032162 A1 Feb. 9, 2012

(30) Foreign Application Priority Data

Aug. 4, 2010 (JP) ................................ 2010-175275
May 13, 2011 (JP) ................................ 2011-108155

(51) Int. Cl.
*G11C 11/24* (2006.01)
*G11C 11/34* (2006.01)
*H01L 27/108* (2006.01)

(52) U.S. Cl.
USPC ......... 365/149; 257/5; 257/300; 257/E27.084

(58) Field of Classification Search
CPC ........... G09G 2300/0842; G11C 11/24; G11C 11/405; G11C 11/565
USPC .............................. 257/5; 365/149, 186, 187
See application file for complete search history.

(56) References Cited

U.S. PATENT DOCUMENTS

| | | | |
|---|---|---|---|
| 4,466,081 A | | 8/1984 | Masuoka |
| 4,528,480 A | * | 7/1985 | Unagami et al. ............ 315/169.1 |
| 5,122,986 A | * | 6/1992 | Lim .......................... 365/189.11 |
| 5,731,856 A | | 3/1998 | Kim et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Jerome Jackson, Jr.
*Assistant Examiner* — Paul Budd
(74) *Attorney, Agent, or Firm* — Eric J. Robinson; Robinson Intellectual Property Law Office, P.C.

(57) ABSTRACT

An object is to provide a semiconductor device which can hold stored data even when not powered and which achieves high integration by reduction of the number of wirings. The semiconductor device is formed using a material which can sufficiently reduce the off-state current of a transistor, e.g., an oxide semiconductor material which is a wide bandgap semiconductor. When a semiconductor material which allows a sufficient reduction in the off-state current of a transistor is used, data can be held for a long period. One line serves as the word line for writing and the word line for reading and one line serves as the bit line for writing and the bit line for reading, whereby the number of wirings is reduced. Accordingly, the storage capacity per unit area is increased.

20 Claims, 27 Drawing Sheets

(56) References Cited

U.S. PATENT DOCUMENTS

| | | | |
|---|---|---|---|
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,804,142 B2 * | 10/2004 | Forbes | 365/149 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,009,459 B2 * | 8/2011 | Wu et al. | 365/149 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0028859 A1 * | 2/2006 | Forbes | 365/149 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |

FOREIGN PATENT DOCUMENTS

| | | |
|---|---|---|
| JP | 57-105889 | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID DIgest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM '09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID DIgest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID , 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID DIgest '07 : SID International Symposium Digest of Technical Papers, 2007, vol. 38, pp. 1737-1740.

Nakamura, "Synthesis of Homologous Compound with Now Long-Period Structure," NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YBFE2O4, and YB2FE3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs,", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.

\* cited by examiner

Potential of SL is fixed to 0V.

Word line for capacitor : The word line is connected to OS word line at outside.

FIG. 12A  FIG. 12B
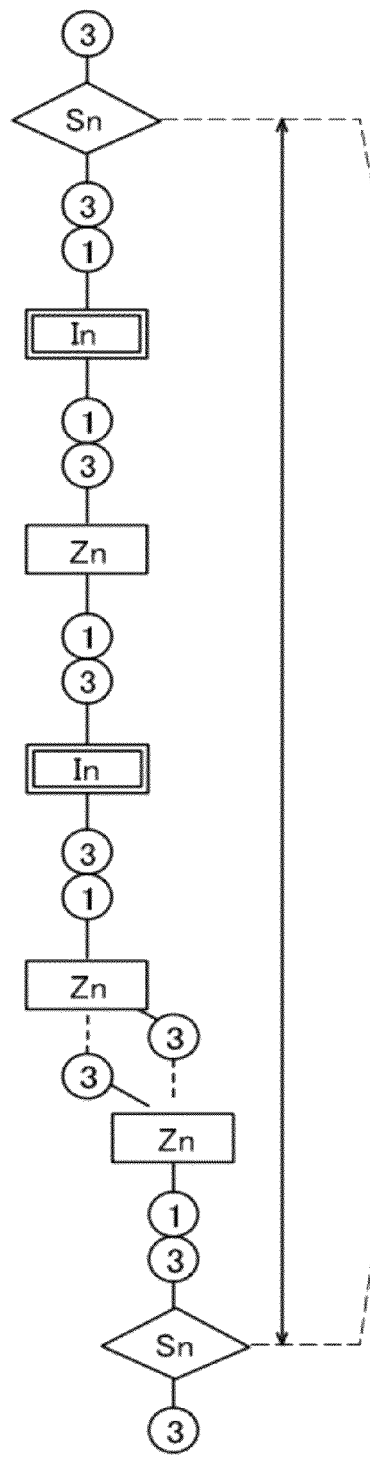
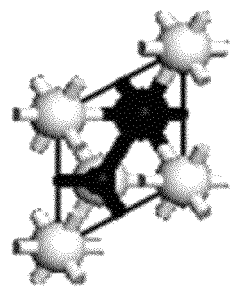
FIG. 12C
- In
- Sn
- Zn
- O

LOW OFF-STATE LEAKAGE CURRENT SEMICONDUCTOR MEMORY DEVICE

BACKGROUND OF THE INVENTION

1. Field of the Invention

The invention disclosed herein relates to a semiconductor device including a semiconductor element.

2. Description of the Related Art

Memory devices including semiconductor elements are broadly classified into two categories: volatile memory devices that lose stored data when not powered, and nonvolatile memory devices that hold stored data even when not powered.

As a typical example of volatile memory devices, a dynamic random access memory (DRAM) is known. A DRAM stores data in such a manner that a transistor included in a storage element is selected and electric charge is stored in a capacitor.

When data is read from a DRAM, electric charge in a capacitor is lost; thus, another write operation is necessary every time data is read out. Moreover, a transistor included in a memory element has leakage current (off-state current) between a source and a drain in an off state or the like and electric charge flows into or out of the transistor even if the transistor is not selected, which makes a data holding period short. For that reason, write operation (refresh operation) is necessary at predetermined intervals, and it is difficult to sufficiently reduce power consumption. Furthermore, since stored data is lost when power supply stops, another memory device utilizing a magnetic material or an optical material is needed in order to hold the data for a long time.

As another example of volatile memory devices, a static random access memory (SRAM) is known. An SRAM holds stored data by using a circuit such as a flip-flop and thus does not need refresh operation, which is an advantage over a DRAM. However, storage capacity per unit area is reduced because a circuit such as a flip-flop is used. Moreover, as in a DRAM, stored data in an SRAM is lost when power supply stops.

As a typical example of nonvolatile memory devices, a flash memory is known. A flash memory includes a floating gate between a gate electrode and a channel formation region in a transistor and stores data by holding charge in the floating gate. Therefore, a flash memory has advantages in that the data holding period is extremely long (semi-permanent) and refresh operation which is necessary to volatile memory devices is not needed (e.g., see Patent Document 1).

However, in a flash memory, there is a problem in that a memory element becomes unable to function after a predetermined number of writing operations because a gate insulating layer included in the memory element deteriorates due to tunneling current generated in writing operations. In order to reduce effects of this problem, a method in which the number of writing operations is equalized among memory elements can be employed, for example, but a complex peripheral circuit is needed to realize this method. Moreover, even when such a method is employed, the fundamental problem of deterioration cannot be resolved. In other words, a flash memory is not suitable for applications in which data is frequently rewritten.

In addition, high voltage is necessary in order to inject charge into the floating gate or removing the charge, and a circuit for that purpose is required. Further, it takes a relatively long time to inject or remove electric charge, and it is not easy to increase the speed of writing or erasing data.

REFERENCE

Patent Document

[Patent Document 1] Japanese Published Patent Application No. S57-105889

SUMMARY OF THE INVENTION

In view of the foregoing problems, an object of one embodiment of the present invention is to provide a semiconductor device which can hold stored data even when not powered and which achieves high integration by reduction of the number of wirings.

In one embodiment of the invention disclosed herein, a semiconductor device is formed using a material which can sufficiently reduce the off-state current of a transistor, e.g., an oxide semiconductor material which is a wide bandgap semiconductor. When a semiconductor material which allows a sufficient reduction in the off-state current of a transistor is used, data can be held for a long period.

One embodiment of the present invention disclosed in this specification is a semiconductor device which includes a source line, n bit lines (n is a natural number), first to m-th memory cells (m is a natural number) connected in series between the source line and the bit lines, m+1 word lines, a first selection line and a second selection line, a first selection transistor including a gate electrode electrically connected to the first selection line, and a second selection transistor including a gate electrode electrically connected to the second selection line. The memory cells each includes a first transistor including a first gate electrode, a first source electrode, and a first drain electrode; a second transistor including a second gate electrode, a second source electrode, and a second drain electrode; and a capacitor. The first transistor includes a substrate including a semiconductor material, and the second transistor includes an oxide semiconductor layer. The source line is electrically connected to the first source electrode in the m-th memory cell through the second selection transistor. One of the bit lines is electrically connected to the first drain electrode of the first memory cell and the second drain electrode of the first memory cell through the first selection transistor. The first word line is electrically connected to the second gate electrode of the first memory cell. A k-th word line (k is a natural number of greater than or equal to 2 and less than or equal to m) is electrically connected to the second gate electrode of a k-th memory cell and is electrically connected to one electrode of the capacitor in a (k−1)-th memory cell. The first drain electrode of the k-th memory cell is electrically connected to the first source electrode of the (k−1)-th memory cell. The first gate electrode of the m-th memory cell, the second source electrode of the m-th memory cell, and the other electrode of the capacitor of the m-th memory cell are electrically connected to one other.

In this specification and the like, ordinal numbers such as "first", "second", and "third" are used in order to avoid confusion among components, and the terms do not limit the components numerically.

Functions of a "source" and a "drain" are sometimes replaced with each other when a transistor of opposite polarity is used or when the direction of current flow is changed in circuit operation, for example. Therefore, the terms "source" and "drain" can be used to denote the drain and the source, respectively, in this specification.

The first transistor includes a channel formation region provided in a substrate including a semiconductor material, impurity regions between which the channel formation region is provided, a first gate insulating layer over the channel formation region, and the first gate electrode provided over the first gate insulating layer so as to overlap with the channel formation region.

The second transistor includes the second source electrode and the second drain electrode that are electrically connected to the oxide semiconductor layer, the second gate electrode overlapping with the oxide semiconductor layer, and a second gate insulating layer between the oxide semiconductor layer and the second gate electrode.

The first transistor is formed to have a conductivity type different from that of the second transistor. In the case where the second transistor including an oxide semiconductor layer is of n-channel type, the first transistor is formed to be of p-channel type.

The substrate including the semiconductor material is preferably a single crystal semiconductor substrate or an SOI substrate. The semiconductor material included in the substrate including the semiconductor material is preferably silicon. The oxide semiconductor layer preferably includes an oxide semiconductor material including In, Ga, and Zn or an oxide semiconductor material including In, Sn, and Zn Note that although the transistor may be formed using an oxide semiconductor in the above embodiments, the invention disclosed herein is not limited thereto. A material which can realize the off-state current characteristics equivalent to those of the oxide semiconductor, such as a wide bandgap material like silicon carbide (specifically, a semiconductor material whose energy gap $E_g$ is larger than 3 eV) may be used.

Since the off-state current of the transistor including an oxide semiconductor is extremely small, stored data can be held for an extremely long time when using such a transistor. In other words, refresh operation becomes unnecessary or the frequency of the refresh operation can be extremely lowered, which leads to a sufficient reduction in power consumption. Moreover, stored data can be held for a long period even when power is not supplied (note that a potential is preferably fixed).

Since a transistor including a material other than an oxide semiconductor, such as silicon, can operate at sufficiently high speed, when this is combined with a transistor including an oxide semiconductor, a semiconductor device can perform operation (e.g., data reading) at sufficiently high speed. Further, a transistor including a material other than an oxide semiconductor can favorably realize a variety of circuits (e.g., a logic circuit or a driver circuit) which needs to operate at high speed.

Further in a semiconductor device of one embodiment of the present invention, the circuit area can be diminished by reducing the number of wirings, which allows the storage capacity per unit area to be increased.

BRIEF DESCRIPTION OF THE DRAWINGS

In the accompanying drawings:

FIGS. 12A to 12C show a crystal structure of an oxide material.

DETAILED DESCRIPTION OF THE INVENTION

Figure 1:
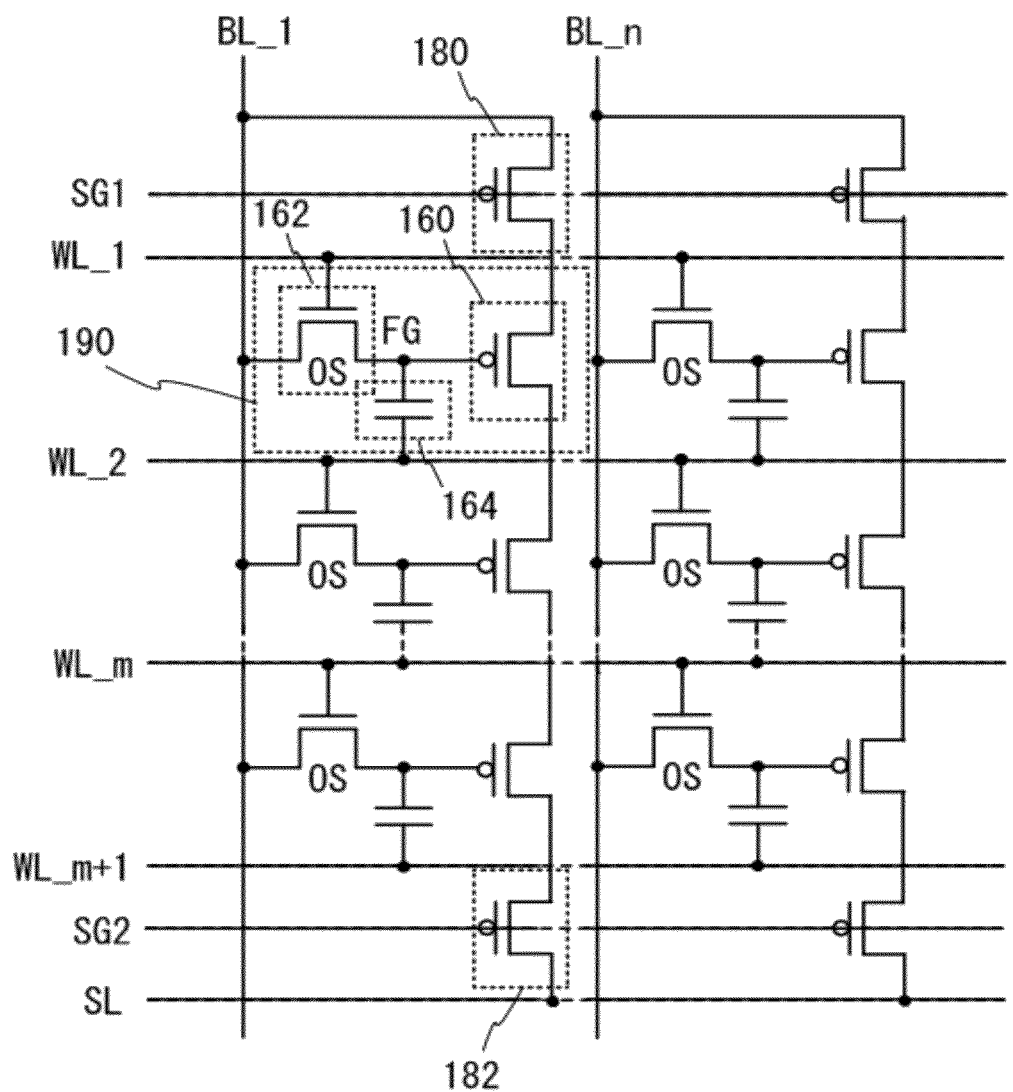
FIG. 1 is a circuit diagram of a semiconductor device.

Hereinafter, embodiments of the invention disclosed herein are described with reference to the drawings. Note that the present invention is not limited to the following description, and it will be easily understood by those skilled in the art that modes and details can be modified in various ways without departing from the spirit and scope of the present invention. Therefore, the present invention should not be construed as being limited to the description in the following embodiments.

Note that the position, the size, the range, or the like of each structure illustrated in drawings and the like is not accurately represented in some cases for easy understanding. Therefore, the invention disclosed herein is not necessarily limited to such position, size, range, and the like disclosed in the drawings and the like.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, the term such as "electrode" or "wiring" does not limit the function of the component. For example, an "electrode" can be used as part of "wiring", and a "wiring" can be used as part of "electrode". Further, the term "electrode" or "wiring" can also mean a combination of a plurality of "electrodes" and "wirings" formed in an integrated manner.

Note that the term "electrically connected" includes the case where components are connected through an "object having any electric function." There is no particular limitation on the "object having any electric function" as long as electric signals can be transmitted and received between components that are connected through the object. Examples of the "object having any electric function" are a switching element such as a transistor, a resistor, an inductor, a capacitor, and an element with a variety of functions as well as an electrode and a wiring.

Embodiment 1

In this embodiment, a circuit configuration and operation of a semiconductor device according to one embodiment of the invention disclosed herein will be described with reference to the drawings. Note that in the circuit diagrams, "OS" may be written beside a transistor in order to indicate that the transistor includes an oxide semiconductor.

FIG. 1 illustrates an example of a circuit configuration of a semiconductor device according to one embodiment of the present invention. A structure including a first transistor 160, a second transistor 162, and a capacitor 164 is a memory cell 190. The structure in FIG. 1 includes n columns, and m memory cells 190 are included in each of the columns. Note that m and n are natural numbers.

Note that there is no particular limitation on the first transistor 160. In terms of increasing the speed of reading data, it is preferable to use, for example, a transistor with high switching rate, such as a transistor including single crystal silicon.

Here, as the second transistor 162, a transistor including an oxide semiconductor is used, for example. A transistor including an oxide semiconductor has a characteristic of a significantly small off-state current. For that reason, a potential of a gate electrode of the first transistor 160 can be held for an extremely long period by turning off the second transistor 162. By providing the capacitor 164, holding of charge applied to the gate electrode of the first transistor 160 and reading of data held can be performed more easily.

The first transistor 160 is formed to have a conductivity type different from that of the second transistor 162. In the case where the second transistor including an oxide semiconductor is of n-channel type, the first transistor is formed to be a p-channel transistor.

In each of the memory cells 190, the gate electrode of the first transistor 160, a source electrode of the second transistor 162, and one electrode of the capacitor 164 are electrically connected to one another.

The number of word lines (WL_1 to WL_m+1) formed orthogonal to bit lines (BL_1 to BL_n) is m+1. A first selection line (SG1) and a second selection line (SG2) are connected to a gate electrode of a first selection transistor 180 and a gate electrode of a second selection transistor 182, respectively.

A source line (SL) is electrically connected to a source electrode of the first transistor in the m-th memory cell through the second selection transistor 182. A bit line is electrically connected to a drain electrode of the first transistor in the first memory cell through the first selection transistor 180.

A first word line (WL_1) is electrically connected to a gate electrode of the second transistor 162 of the first memory cell. Further, the k-th word line (k is a natural number of greater than or equal to 2 and less than or equal to m) is electrically connected to a gate electrode of the second transistor of the k-th memory cell and is also electrically connected to the other electrode of the capacitor in the (k−1)-th memory cell.

A drain electrode of the first transistor in the k-th memory cell is connected to the source electrode of the first transistor in the (k−1)-th memory cell; accordingly, the memory cells 190 are electrically connected to one another between the source line and the bit line.

Next, a basic circuit configuration of the memory cell 190 and the operation thereof will be described with reference to FIGS. 2A and 2B. Here, the first transistor 160 is a p-channel transistor and the second transistor 162 is an n-channel transistor.

Figure 2A:
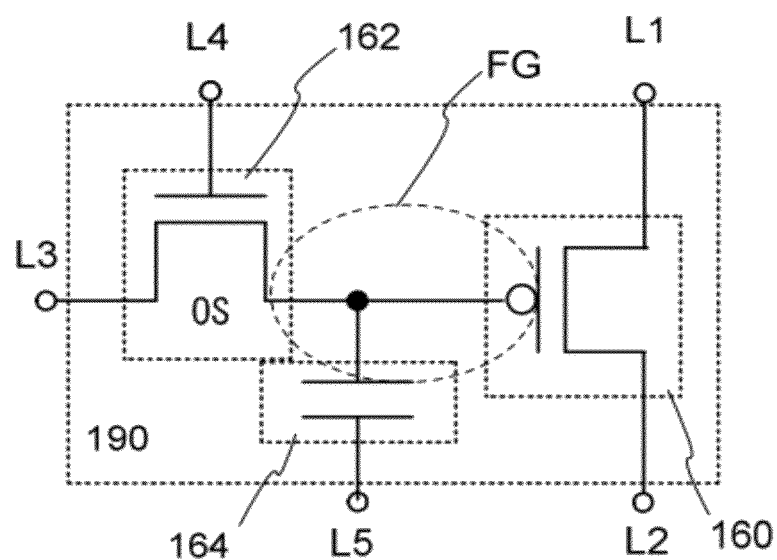
FIGS. 2A and 2B are circuit diagrams of a semiconductor device.

In the semiconductor device illustrated in FIG. 2A, a first wiring (L1) and the drain electrode (or the source electrode) of the first transistor 160 are electrically connected to each other, and a second wiring (L2) and the source electrode (or the drain electrode) of the first transistor 160 are electrically connected to each other. Further, a third wiring (L3) and the drain electrode (or the source electrode) of the second transistor 162 are electrically connected to each other, and a fourth wiring (L4) and the gate electrode of the second transistor 162 are electrically connected to each other. Furthermore, the gate electrode of the first transistor 160 and the source electrode (or the drain electrode) of the second transistor 162 are electrically connected to one electrode of the capacitor 164. A fifth wiring (L5) is electrically connected to the other electrode of the capacitor 164.

The semiconductor device illustrated in FIG. 2A utilizes a characteristic in which the potential of the gate electrode of the first transistor 160 can be held, whereby writing, holding, and reading of data can be performed as follows.

First of all, writing and holding of data will be described. First, the potential of the fourth wiring is set to a potential at which the second transistor 162 is on, so that the second transistor 162 is turned on. Accordingly, the potential of the third wiring is supplied to the gate electrode of the first transistor 160 and the capacitor 164. That is, predetermined charge is supplied to the gate electrode of the first transistor 160 (writing). Here, one of two kinds of charges providing different potentials (hereinafter, a charge providing a low potential is referred to as charge $Q_L$ and a charge providing a high potential is referred to as charge $Q_H$) is applied. Note that three or more kinds of charges providing different potentials may be applied to improve storage capacity. After that, the potential of the fourth wiring is set to a potential at which the second transistor 162 is off, so that the second transistor 162 is turned off. Thus, the charge supplied to the gate electrode of the first transistor 160 is held (holding).

Since the off-state current of the second transistor 162 including an oxide semiconductor is significantly small, the charge in the gate electrode of the first transistor 160 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held in the gate electrode of the first transistor 160. This is because in general, when the first transistor 160 is a p-channel transistor, an apparent threshold voltage $V_{th\_H}$ in the case where $Q_H$ is given to the gate electrode of the first transistor 160 is lower than an apparent threshold voltage $V_{th\_L}$ in the case where $Q_L$ is given to the gate electrode of the first transistor 160. Here, an apparent threshold voltage refers to the potential of the fifth wiring, which is needed to turn on the first transistor 160. Thus, the potential of the fifth wiring is set to a potential $V_0$ intermediate between $V_{th\_H}$ and $V_{th\_L}$, whereby charge supplied to the gate electrode of the first transistor 160 can be determined. For example, in the case where $Q_H$ is supplied in writing, when the potential of the fifth wiring is $V_0$ ($>V_{th\_H}$), the first transistor 160 remains in an off state. In the case where $Q_L$ is supplied in writing, when the potential of the fifth wiring is $V_0$ ($<_{th\_L}$), the first transistor 160 is turned on. Therefore, the data held can be read by measuring the potential of the second wiring.

Note that in the case where memory cells are arrayed as illustrated in FIG. 1, it is necessary that data of only a desired memory cell can be read. In the case where data of the predetermined memory cell is read out and data of the other memory cells is not read out, a potential at which the first transistor 160 is in an off state regardless of the state of the gate electrode, that is, a potential higher than $V_{th\_L}$, may be applied to the fifth wirings of the memory cells whose data is not to be read. Alternatively, a potential at which the first transistor 160 is in an on state regardless of the state of the gate electrode, that is, a potential lower than $V_{th\_H}$, may be applied to the fifth wirings.

Next, rewriting of data will be described. Rewriting of data is performed in a manner similar to that of the above writing and holding of data. That is, the potential of the fourth wiring is set to a potential at which the second transistor 162 is on, so that the second transistor 162 is turned on. Accordingly, the potential of the third wiring (a potential for new data) is supplied to the gate electrode of the first transistor 160 and the capacitor 164. After that, the potential of the fourth wiring is set to a potential at which the second transistor 162 is off, so that the second transistor 162 is turned off. Accordingly, the gate electrode of the first transistor 160 is supplied with charge for new data.

In the semiconductor device according to an embodiment of the invention disclosed herein, data can be directly rewritten by another data writing operation as described above. Therefore, extraction of charge from a floating gate with the use of a high voltage which is necessary for a flash memory or the like is not needed, and thus a decrease in operation speed due to erasing operation can be suppressed. In other words, high-speed operation of the semiconductor device can be realized.

Note that the source electrode (or the drain electrode) of the second transistor 162 is electrically connected to the gate electrode of the first transistor 160 and therefore has a function similar to that of a floating gate of a floating gate transistor used as a nonvolatile memory element. A portion where the drain electrode (or the source electrode) of the second transistor 162 and the gate electrode of the first transistor 160 are electrically connected to each other is called a node FG in some cases. When the second transistor 162 is off, the node FG can be regarded as being embedded in an insulator and thus charge is held at the node FG. The off-state current of the second transistor 162 including an oxide semiconductor is smaller than or equal to 1/100000 of the off-state current of a transistor including a silicon semiconductor; thus, loss of the charge accumulated in the node FG due to leakage in the second transistor 162 is negligible. That is, with the second transistor 162 including an oxide semiconductor, a nonvolatile memory device which can hold data without being supplied with power can be realized.

For example, when the off-state current of the second transistor 162 at room temperature (25° C.) is 10 zA (1 zA (zeptoampere) is $1\times10^{-21}$ A) or less and the capacitance of the capacitor 164 is approximately 10 fF, data can be held for $10^4$ seconds or longer. It is needless to say that the holding time depends on transistor characteristics and capacitance.

Further, the semiconductor device according to an embodiment of the invention disclosed herein does not have the problem of deterioration of a gate insulating layer (a tunnel insulating film), which is a problem of a conventional floating gate transistor. That is, the problem of deterioration of a gate insulating layer due to injection of electrons into a floating gate, which is a conventional problem, can be solved. This means that there is no limit on the number of write cycles in principle. Furthermore, a high voltage needed for writing or erasing in a conventional floating gate transistor is not necessary.

Figure 2B:
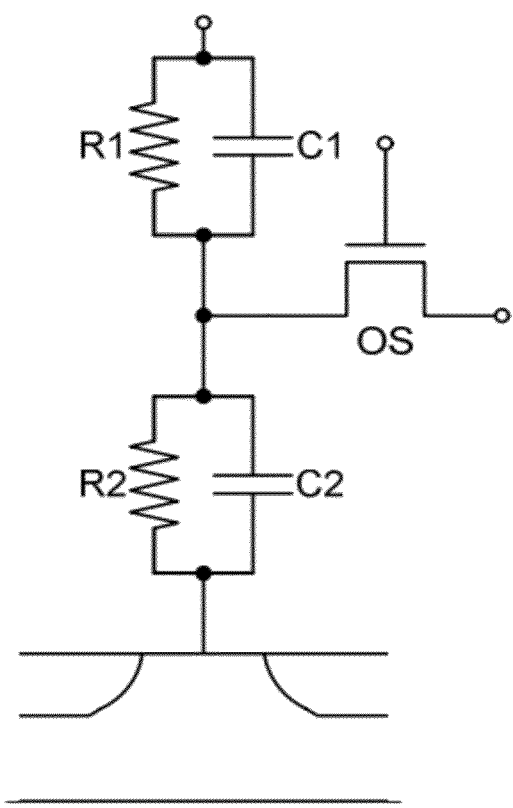

Components such as transistors in the semiconductor device in FIG. 2A can be regarded as including resistors and capacitors as illustrated in FIG. 2B. That is, in FIG. 2A, the first transistor 160 and the capacitor 164 are each regarded as including a resistor and a capacitor. R1 and C1 denote the resistance and the capacitance of the capacitor 164, respectively. The resistance R1 corresponds to the resistance of the insulating layer included in the capacitor 164. R2 and C2 denote the resistance and the capacitance of the first transistor 160, respectively. The resistance R2 corresponds to the resistance of the gate insulating layer at the time when the first transistor 160 is on. The capacitance C2 corresponds to a so-called gate capacitance (capacitance formed between the gate electrode and the source or drain electrode, and capacitance formed between the gate electrode and the channel formation region).

A charge holding period (also referred to as a data holding period) is determined mainly by the off-state current of the second transistor 162 under the conditions where the gate leakage current of the second transistor 162 is sufficiently small and R1 and R2 satisfy R1≧ROS (R1 is greater than or equal to ROS) and R2≧ROS (R2 is greater than or equal to ROS), where ROS is the resistance (also referred to as effective resistance) between the source electrode and the drain electrode in a state where the second transistor 162 is off.

On the other hand, in the case where the above conditions are not satisfied, it is difficult to secure a sufficient holding period even if the off-state current of the second transistor 162 is sufficiently small. This is because a leakage current other than the off-state current of the second transistor 162 (e.g., a leakage current generated between the source electrode and the gate electrode of the first transistor 160) is large. Accordingly, it can be said that it is preferable that the semiconductor device disclosed in this embodiment satisfies the relations of R1≧ROS (R1 is greater than or equal to ROS) and R2≧ROS (R2 is greater than or equal to ROS).

Meanwhile, it is desirable that C1 and C2 satisfy C1≧C2 (C1 is greater than or equal to C2). This is because if C1 is large, when the potential of the node FG is controlled by the fifth wiring, the potential of the fifth wiring can be efficiently supplied to the node FG and the difference between potentials supplied to the fifth wiring (e.g., a reading potential and a non-reading potential) can be kept small.

When the above relations are satisfied, a more favorable semiconductor device can be realized. Note that R1 and R2 depend on the gate insulating layer of the first transistor 160 and the insulating layer of the capacitor 164. The same applies to C1 and C2. Therefore, the material, the thickness, and the like of the gate insulating layer are preferably set as appropriate to satisfy the above relations.

In the semiconductor device described in this embodiment, the node FG has a function similar to that of a floating gate of a floating gate transistor of a flash memory or the like, but the node FG of this embodiment has a feature which is essentially different from that of the floating gate of the flash memory or the like.

In the case of a flash memory, since a high potential is applied to a control gate, it is necessary to keep a proper distance between cells in order to prevent the potential of the control gate from affecting a floating gate of an adjacent cell. This is one factor inhibiting higher integration of the semiconductor device. The factor is attributed to a basic principle of a flash memory, in which a tunneling current is generated by application of a high electric field.

On the other hand, the semiconductor device according to this embodiment is operated by switching of a transistor including an oxide semiconductor and does not use the above-described principle of charge injection by a tunneling current. That is, a high electric field for charge injection is not necessary, unlike a flash memory. Accordingly, it is not necessary to consider an influence of a high electric field from a control gate on an adjacent cell, and this facilitates an increase in the degree of integration.

In addition, the semiconductor device according to this embodiment is advantageous over a flash memory also in that a high electric field is not necessary and a large peripheral circuit (such as a step-up circuit) is not necessary. For example, the highest voltage applied to the memory cell according to this embodiment (the difference between the highest potential and the lowest potential applied to respective electrodes of the memory cell at the same time) can be 5 V or less, preferably 3 V or less, in one memory cell in the case where data of two stages (one bit) is written.

In the case where the relative permittivity $\epsilon r1$ of the insulating layer included in the capacitor 164 is different from the relative permittivity $\epsilon r2$ of the insulating layer included in the first transistor 160, it is easy to satisfy $C1 \geq C2$ (C1 is greater than or equal to C2) while satisfying $2 \cdot S2 \geq S1$ ($2 \cdot S2$ is greater than or equal to S1), preferably $S2 \geq S1$ (S2 is greater than or equal to S1), where S1 is the area of the insulating layer included in the capacitor 164 and S2 is the area of the insulating layer forming a gate capacitor of the first transistor 160. In other words, C1 can easily be made greater than or equal to C2 while the area of the insulating layer included in the capacitor 164 is made small. Specifically, for example, a film including a high-k material such as hafnium oxide or a stack of a film including a high-k material such as hafnium oxide and a film including an oxide semiconductor is used for the insulating layer included in the capacitor 164 so that $\epsilon r1$ can be set to 10 or more, preferably 15 or more, and silicon oxide is used for the insulating layer forming the gate capacitor so that $\epsilon r2$ can be set to 3 to 4.

A combination of such structures enables the semiconductor device according to one embodiment of the invention disclosed herein to have further higher integration.

Note that in addition to the increase in the degree of integration, a multilevel technique can be employed to increase the storage capacity of the semiconductor device. For example, three or more levels of data are written to one memory cell, whereby the storage capacity can be increased as compared to the case where two-level (one-bit) data is written. The multilevel technique can be achieved by, for example, supplying charge Q providing a potential to the gate electrode of the first transistor, in addition to charge $Q_L$ providing a low potential and charge $Q_H$ providing a high potential as described above.

Next, operation of a semiconductor device in which memory cells are arrayed will be described.

Figure 3:
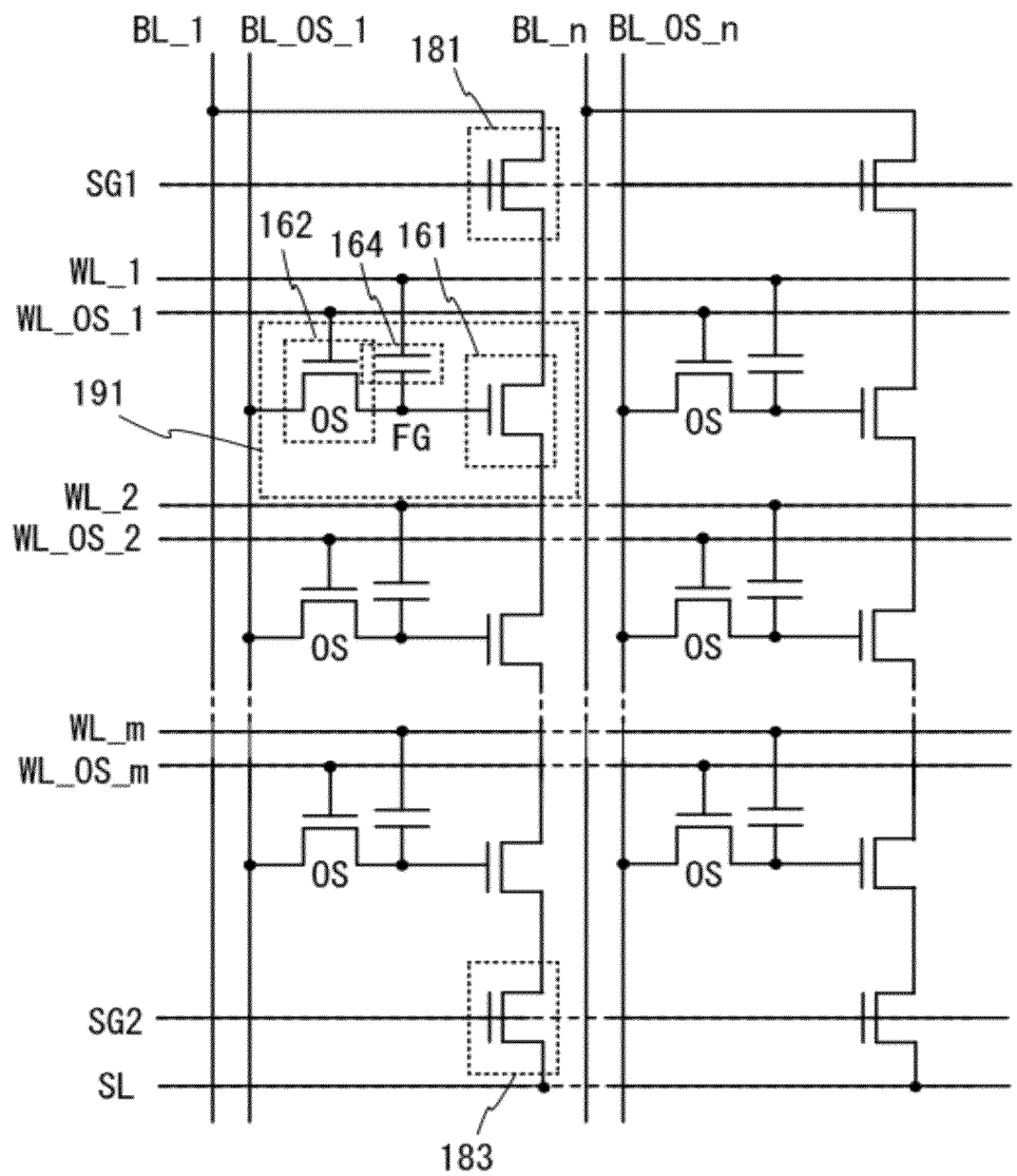
FIG. 3 is a circuit diagram of a semiconductor device.

First, an example of an operation method in the case where transistors included in the memory cells are of n-channel type will be described. A semiconductor device illustrated in FIG. 3 is an example of a NAND-type semiconductor device in which memory cells 191 are arrayed, where n columns are included and m memory cells 191 are included in each of the n columns. Note that m and n are natural numbers. Each memory cell 191 differs from the memory cell 190 only in having the first transistor 161 of n-channel type, although they are equivalent in structure.

Description will be made on the first memory cell 191 in the first column. The first wiring (L1), the second wiring (L2), the third wiring (L3), the fourth wiring (L4), and the fifth wiring (L5) in FIG. 2A correspond to a first bit line (BL_1), a source line (SL), a second bit line (BL_OS_1), a second word line (WL_OS_1), and a first word line (WL_1), respectively.

Note that although the case where either a potential V2 (a potential lower than a power supply potential VDD) or a reference potential GND (0 V) is supplied to the node FG is described here as an example, the relation among potentials supplied to the node FG is not limited to this example. Data that is held when the potential V2 is supplied to the node FG is referred to as data "1", and data that is held when the reference potential GND (0 V) is supplied to the node FG is referred to as data "0".

First, the potential of the first selection line (SG1) is set to GND (0 V), and the potential of the second selection line (SG2) is set to V1 (e.g., VDD). The potential of the second word line (WL_OS) connected to the memory cell 191 to which data is to be written is set to V3 (a potential higher than V2, e.g., VDD) so that the memory cell 191 is selected.

In the case of writing data "0" to the memory cell 191, GND is supplied to the second bit line (BL_OS), and in the case of writing data "1" to the memory cell 191, V2 is supplied to the second bit lines BL_OS. Because the potential of the second word line (WL_OS) is V3 here, V2 can be supplied to the node FG.

Data is held by setting the potential of the second word line (WL_OS) connected to the memory cell 191 in which data is to be held to GND. When the potential of the second word line (WL_OS) is fixed to GND, the potential of the node FG is fixed to the potential at the time of writing. In other words, when V2 for data "1" is supplied to the node FG, the potential of the node FG is V2, and when GND (0 V) for data "0" is supplied to the node FG, the potential of the node FG is GND (0 V).

Because GND (0 V) is supplied to the second word line (WL_OS), the second transistor 162 is turned off regardless of whether data "1" or data "0" is written. Since the off-state current of the second transistor 162 is significantly small, the charge in the gate electrode of the first transistor 161 is held for a long time.

Data is read by setting the potential of the first word line (WL) connected to the memory cell 191 from which the data is to be read to GND (0 V), by setting the potentials of the first word lines (WL) connected to the memory cells 191 from which the data is not to be read to V5 (e.g., VDD), by setting the potentials of the first selection line (SG1) and the second selection line (SG2) to V1, and by turning on the first selection transistor 181 and the second selection transistor 183. A necessary potential V6 (e.g., a potential lower than or equal to VDD) is supplied to the first bit line (BL).

When the potential of the first word line (WL) connected to the memory cell 191 from which data is to be read is set to GND (0 V), the first transistor 161 is turned on if V2 for data "1" is supplied to the node FG of the memory cell 191 from which data is to be read. On the other hand, the first transistor 161 is turned off if GND (0 V) for data "0" is supplied to the node FG.

When the potential of the first word line WL connected to the memory cell 191 from which data is not to be read is set to V5, the first transistor 161 is turned on regardless of whether data "1" or data "0" is written in the memory cell 191 from which data is not to be read. Thus, the held data can be read.

Here, the number of wirings related to the above operation in the semiconductor device illustrated in FIG. 3 are as follows: the number of word lines (WL, WL_OS) is 2m, the number of bit lines (BL, BL_OS) is 2n, the number of source lines (SL) is 1, and the number of selection lines (SG) is 2; thus, four wirings are necessary for word lines and bit lines alone per memory cell. Therefore, the circuit area cannot be reduced and it has been difficult to increase the storage capacity per unit area.

Figure 4:
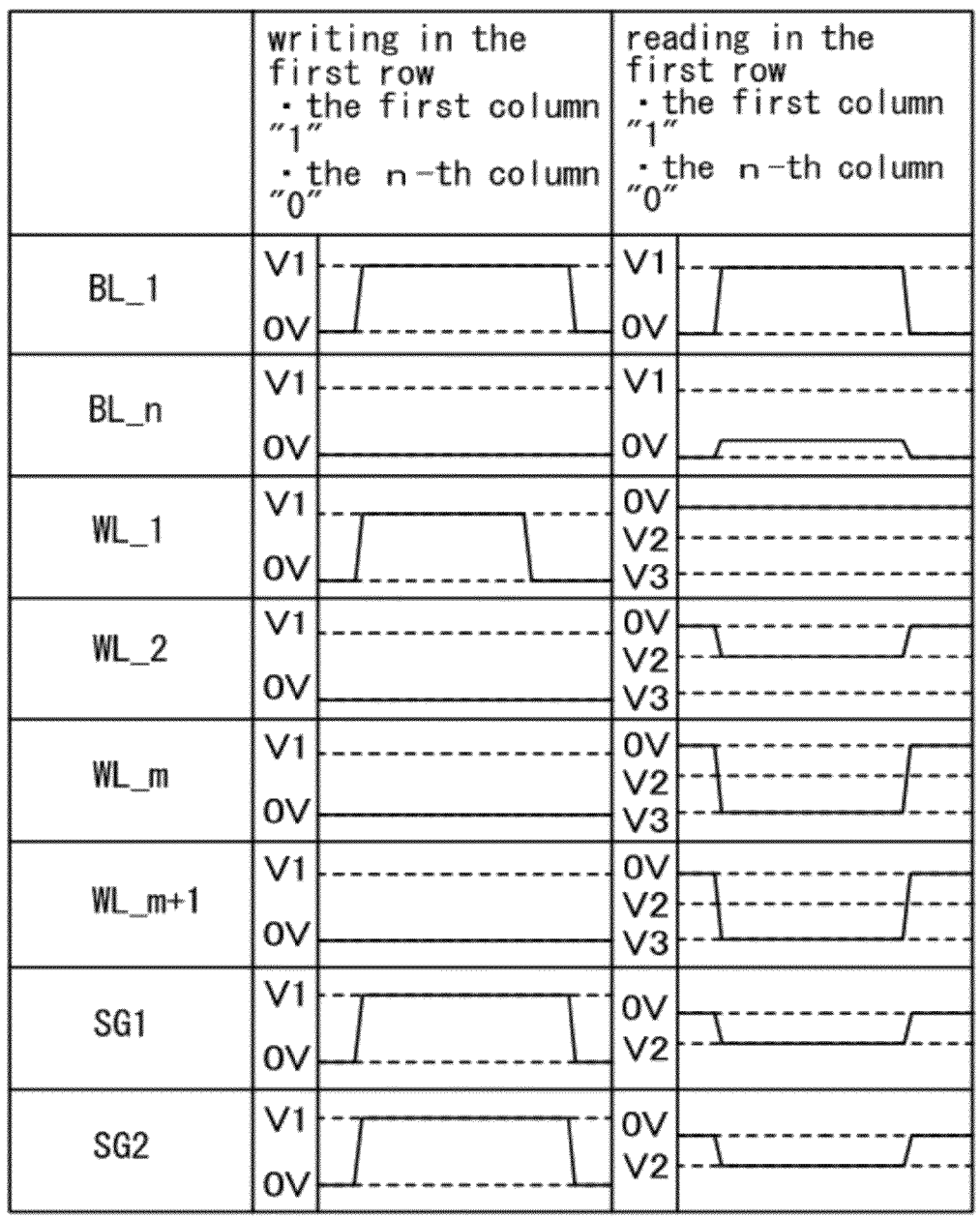
FIG. 4 is a timing chart.

Next, operation of the semiconductor device illustrated in FIG. 1 which is an embodiment of the present invention will be described with reference to a timing chart of FIG. 4. Note that the number of wirings in the semiconductor device of FIG. 1 is as follows: the number of word lines (WL) is m+1, the number of bit lines (BL) is n, the number of source lines (SL) is 1, and the number of selection lines (SG) is 2. That is, one line serves as the word line for writing and the word line for reading and one line serves as the bit line for writing and the bit line for reading, whereby the number of wirings is reduced.

Note that although the case where either a potential V1 (e.g., VDD) or a reference potential GND (0 V) is supplied to the node FG is described here as an example, the relationship among potentials supplied to the node FG is not limited to this example. Data that is held when the potential V1 is supplied to the node FG is referred to as data "1", and data that is held when the reference potential GND (0 V) is supplied to the node FG is referred to as data "0".

In this embodiment, for simple explanation, a case where data "1" is written to the memory cell in the first row and the first column and data "0" is written to the memory cell in the first row and n-th column will be described. First, in order not to electrically connect the first transistors 160 in series to each other at the time of writing, the potentials of the first selection line SG1 and the second selection line SG2 are set to V1, so that the first selection transistor 180 and the second selection transistor 182 are turned off certainly.

The potential of the word line (WL_1) in a row to which writing is performed is set to V1, and the potentials of the word lines other than the above word line are set to GND. At this time, if the threshold voltages (Vth_OS) of the second transistors 162 satisfy the following relation: V1>Vth_OS>0V (GND), the second transistors 162 in the first row are turned on and the second transistors 162 in the other rows are turned off.

Here, the potential of the bit line (BL_1) in the first column is set to V1 and the potential of the bit line (BL_n) in the n-th column is set to GND, so that the potential of the node FG in the first row and the first column becomes V1 and the potential of the node FG in the first row and the n-th column becomes 0 V.

Then, the potential of the word line (WL_1) is set to GND (0 V) to turn off the second transistors 162 in the first row; in this manner, the potentials of the nodes FG are each held.

Because GND (0 V) is supplied to the word line (WL_1), the second transistors 162 are turned off regardless of whether data "1" or data "0" is written. Since the off-state current of the second transistors 162 is significantly small, the charge in the gate electrodes of the first transistors 160 is held for a long time.

Next, an example of reading out data from the memory cells in the first row will be described with reference to the timing chart of FIG. 4.

First, in order to electrically connect the first transistors 160 in series to each other at the time of reading, the potentials of the first selection line SG1 and the second selection line SG2 are set to V2, so that the first selection transistor 180 and the second selection transistor 182 are turned on. Then, the potential of the word line (WL2) in the row next below the row (the first row) in which reading is to be performed is set to V2, the potential of the word line (WL_1) is set to 0 V (or to a potential lower than or equal to Vth_OS), and the potentials of the other word lines are set to V3. As a result, all the first transistors 160 in the rows other than the row in which reading is to be performed are turned on regardless of the state of the data in the memory cells.

Here, a negative potential for operating the first transistors 160 which are p-channel transistors is applied to the word lines other than the word line (WL_1). Accordingly, the second transistors 162 which are n-channel transistors connected to the word lines other than the word line (WL_1) are not turned on and the potentials of the nodes FG are each held.

The operation state of the first transistors 160 in the row in which reading is to be performed depends on the data held in the memory cells. In other words, the first transistor 160 is turned on in the first row and the n-th column where data "0" is held and turned off in the first row and the first column where data "1" is held.

Accordingly, when the potentials of all the bit lines are set to V1, the source line (SL) with a potential of 0 V is electrically connected to the bit line (BL_n), and as the result, the potential of the bit line (BL_n) converges to 0 V. In addition, the potential V1 is held in the bit line (BL_1). In this manner, the held data can be read out.

Here, the first transistor 160 is a normally-off (in an off state at a gate voltage of 0 V) p-channel transistor, and assuming that the sum of the threshold voltage of the first transistor 160 and the potential of the capacitor is Vth0 for the data "0" and Vth1 for the data "1", the following relation can be obtained: V3<Vth1<V2<Vth0<0 V.

From FIG. 1, a combination of the first selection line (SG1) and the first selection transistor 180 can be omitted. Alternatively, a combination of the second selection line (SG2) and the second selection transistor 182 can be omitted. In such a case, writing, holding, and reading of data can be basically performed in a manner similar to that of the above-described operations.

Thus, operation of the semiconductor device has been described in which data can be held at and read out from the node FG also with the structure in which the number of signal lines (the number of wirings) is reduced as compared to that of the structure of FIG. 3. Thus, with the use of the structure of semiconductor device according to an embodiment of the present invention, the circuit area can be reduced and the storage capacity per unit area can be increased.

Note that it is possible to reduce the number of bit lines by connecting the second transistors 162 between memory cells in series; however, in such a case, all bits have to be erased at the time of data rewriting. In the structure of the semiconductor device according to one embodiment of the present invention, the second transistors 162 are not connected between memory cells in series and all bits need not be erased; therefore, excellent random accessibility and reduced power consumption can be achieved.

Note that the structures, methods, and the like described in this embodiment can be combined as appropriate with any of the structures, methods, and the like described in the other embodiments.

Embodiment 2

In this embodiment, a structure and a manufacturing method of a semiconductor device according to one embodiment of the invention disclosed herein will be described with reference to drawings.

Figure 5A:
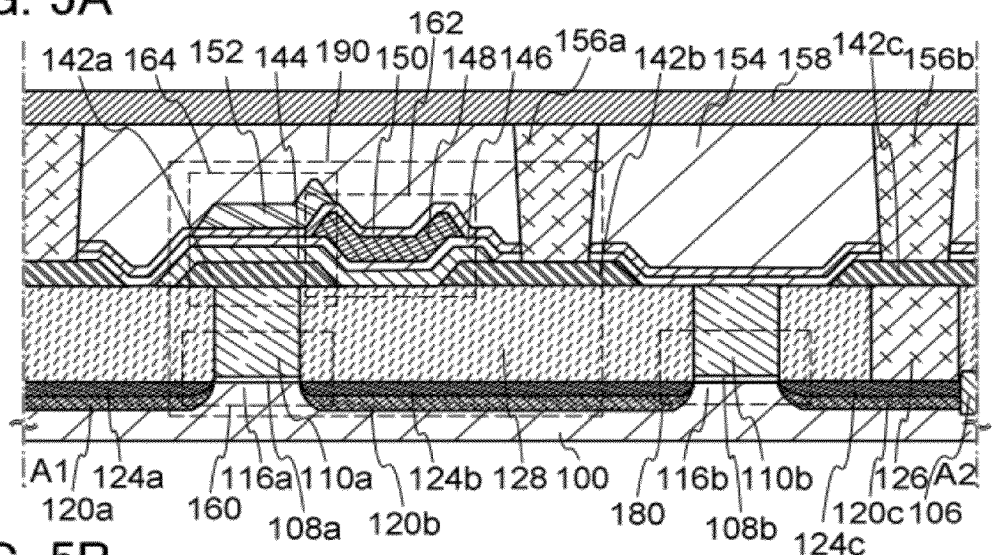
FIGS. 5A and 5B are a cross-sectional view and a plan view of a semiconductor device.
Figure 5B:
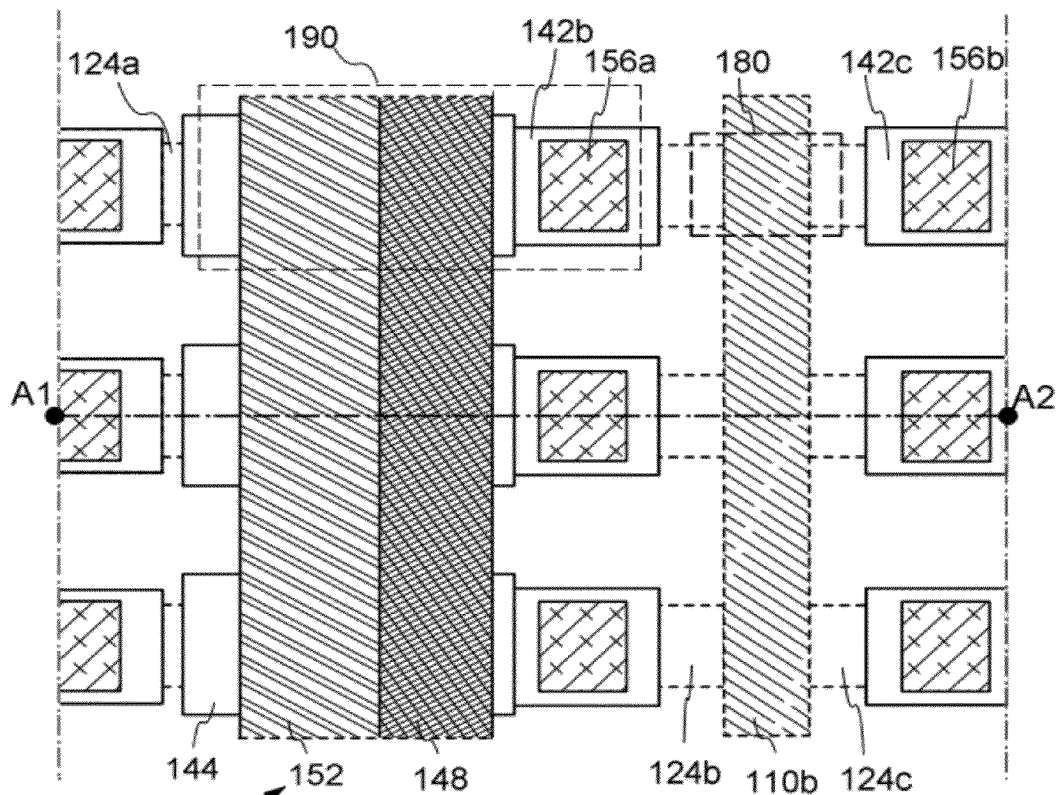

FIGS. 5A and 5B illustrate an example of the structure of the semiconductor device (the memory cell 190 and the first selection transistor 180) illustrated in the circuit diagram of FIG. 1. FIGS. 5A and 5B are a cross-sectional view and a plan view, respectively, of the semiconductor device. Here, FIG. 5A corresponds to a cross section along line A1-A2 in FIG. 5B. In FIG. 5B, the direction along A1-A2 is the column direction in the circuit diagram of FIG. 1, and the direction perpendicular to A1-A2 is the row direction in the circuit diagram of FIG. 1. Note that in FIG. 5B, wirings (electrodes) or the like are emphasized and insulating layers or the like are omitted for simple explanation.

In the semiconductor device illustrated in FIGS. 5A and 5B, the first transistor 160 and the first selection transistor 180 which include a first semiconductor material are included in a lower portion, and the second transistor 162 including a second semiconductor material is included in an upper portion. In FIGS. 5A and 5B, the first transistor 160 and the second transistor 162 in the first row are illustrated, but actually the source electrodes (source regions) and the drain electrodes (drain regions) of the first transistors 160 in the first to m-th rows are connected in series as illustrated in the circuit diagram of FIG. 1.

Here, the first semiconductor material and the second semiconductor material are preferably different materials. For example, the first semiconductor material can be a semiconductor material (such as silicon) other than an oxide semiconductor, and the second semiconductor material can be an oxide semiconductor. A transistor including a material other than an oxide semiconductor, such as single crystal silicon, can operate at high speed easily. On the other hand, a transistor including an oxide semiconductor can hold electric charge for a long time owing to its characteristics.

Although description is here made under the assumption that the first transistor 160 is a p-channel transistor and the second transistor 162 is an n-channel transistor according to the circuit configuration of FIG. 1, the semiconductor device can operate even if the first transistor 160 is an n-channel transistor and the second transistor 162 is a p-channel transistor. The technical nature of the invention disclosed herein is to use a semiconductor material with which off-state current can be sufficiently decreased, such as an oxide semiconductor, in the second transistor 162 so that data can be held. Therefore, it is not necessary to limit a specific structure of the semiconductor device, such as a material of the semiconductor device or the structure of the semiconductor device, to the structure described here.

The first transistor 160 in FIGS. 5A and 5B includes a channel formation region 116a provided in a substrate 100 including a semiconductor material (such as silicon), an impurity region 120a and an impurity region 120b provided so that the channel formation region 116a is sandwiched therebetween, a metal compound region 124a and a metal compound region 124b in contact with the impurity region 120a and the impurity region 120b, a gate insulating layer 108a provided over the channel formation region 116a, and a gate electrode 110a provided over the gate insulating layer 108a.

Note that a transistor whose source electrode and drain electrode are not illustrated in a drawing may also be referred to as a transistor for the sake of convenience. Further, in such a case, in description of a connection of a transistor, a source region and a source electrode may be collectively referred to as a source electrode, and a drain region and a drain electrode may be collectively referred to as a drain electrode. That is, in this specification, the term "source electrode" may include a source region and the term "drain electrode" may include a drain region.

Note that in this specification, the impurity region 120a, the impurity region 120b, and an impurity region 120c to be described later are collectively referred to as an impurity region 120 in some cases. Further, in this specification, the metal compound region 124a, the metal compound region 124b, and a metal compound region 124c to be described later are collectively referred to as a metal compound region 124 in some cases.

Here, the first transistors 160 in the first to m-th rows share the impurity regions 120 and the metal compound regions 124 functioning as source regions and drain regions, and are connected in series. That is, the impurity region 120 and the metal compound region 124 functioning as a source region of the first transistor 160 in the (k−1)-th row (k is a natural number greater than or equal to 2 and less than or equal to m) function as a drain region of the first transistor 160 in the k-th row.

In this manner, the first transistors 160 of the memory cells 190 are connected in series, whereby the source regions and the drain regions can be shared by the first transistors 160 of the memory cells 190. That is, in each of the memory cells 190, one of the source region and the drain region of the first transistor 160 does not need to be connected to a wiring 158 through an opening. Therefore, the opening for connection with the wiring 158 does not need to be provided in the planar layout of the first transistor 160, and the planar layout of the first transistor 160 can easily overlap with the planar layout of the second transistor 162 which is described later; thus, the area occupied by the memory cells 190 can be reduced.

The first transistor 160 in the first row is electrically connected to the bit line (BL) through the first selection transistor 180; thus, the impurity region 120b and the metal compound region 124b functioning as a drain region of the first transistor 160 in the first row function as a source region of the first selection transistor 180. Here, the first selection transistor 180 can have the same structure as the first transistor 160 described above.

That is, the first selection transistor 180 includes a channel formation region 116b provided in the substrate 100 including a semiconductor material (e.g., silicon); the impurity region 120b and the impurity region 120c provided such that the channel formation region 116b is sandwiched therebetween; the metal compound region 124b and the metal compound region 124c in contact with the impurity region 120b and the impurity region 120c; a gate insulating layer 108b provided over the channel formation region 116b; and a gate electrode 110b provided over the gate insulating layer 108b. Note that the gate electrode 110b of the first selection transistor 180 functions as the selection line SG in the circuit diagram of FIG. 1.

Note that in this specification, the channel formation region 116a and the channel formation region 116b are collectively referred to as a channel formation region 116 in some cases. Further, in this specification, the gate insulating layer 108a and the gate insulating layer 108b are collectively referred to as a gate insulating layer 108 in some cases. Furthermore, in this specification, the gate electrode 110a and the gate electrode 110b are collectively referred to as a gate electrode 110 in some cases.

The substrate 100 is provided with an element isolation insulating layer 106 which surrounds the first transistor 160 and the first selection transistor 180. An insulating layer 128 is provided over the first transistor 160 and the first selection transistor 180 so as to expose a top surface of the gate electrode 110. Note that for higher integration, it is preferable that, as in FIGS. 5A and 5B, the first transistor 160 does not have a sidewall insulating layer. On the other hand, when the characteristics of the first transistor 160 have priority, the sidewall insulating layer may be formed on a side surface of the gate electrode 110 and the impurity regions 120 may include a region having a different impurity concentration.

Here, the insulating layer 128 preferably has a surface with favorable planarity; for example, the surface of the insulating layer 128 preferably has a root-mean-square (RMS) roughness of 1 nm or less.

The second transistor 162 in FIGS. 5A and 5B includes a source electrode 142a and a drain electrode 142b formed over the insulating layer 128; an oxide semiconductor layer 144 in contact with part of the insulating layer 128, the source electrode 142a, and the drain electrode 142b; a gate insulating layer 146 covering the oxide semiconductor layer 144; and a gate electrode 148 provided over the gate insulating layer 146 so as to overlap with the oxide semiconductor layer 144. Note that the gate electrode 148 functions as the word line WL in the circuit diagram of FIG. 1.

The second transistor 162 is a top-gate bottom-contact (TGBC) transistor in FIGS. 5A and 5B but is not limited to the illustrated structure. For example, the second transistor 162 may be a top-gate top-contact (TGTC) transistor, a bottom-gate bottom-contact (BGBC) transistor, a bottom-gate top-contact (BGTC) transistor, or the like.

Although not shown, buffer layers having n-type conductivity may be provided between the source electrode 142a and the oxide semiconductor layer 144 and between the drain electrode 142b and the oxide semiconductor layer 144. The buffer layers can reduce the contact resistance between the source electrode 142a and the oxide semiconductor layer 144 and between the drain electrode 142b and the oxide semiconductor layer 144, whereby the on-state current of the transistor can be increased.

As a material which can be used for the buffer layer having n-type conductivity, a metal oxide such as indium oxide (an In—O-based material), indium tin oxide (an In—Sn—O-based material), indium zinc oxide (an In—Zn—O-based material), tin oxide (a Sn—O-based material), zinc oxide (a Zn—O-based material), or tin zinc oxide (a Sn—Zn—O-based material) is typically used. One or more elements selected from aluminum (Al), gallium (Ga), and silicon (Si) may be contained in the above metal oxide. Alternatively, titanium oxide (Ti—O), titanium niobium oxide (a Ti—Nb—O-based material), molybdenum oxide (a Mo—O-based material), tungsten oxide (a W—O-based material), magnesium oxide (a Mg—O-based material), calcium oxide (a Ca—O-based material), gallium oxide (a Ga—O-based material), or the like can be used. Nitrogen (N) may be contained in the above materials.

Here, the oxide semiconductor layer 144 is preferably an oxide semiconductor layer which is purified by sufficiently removing an impurity such as hydrogen therefrom or by sufficiently supplying oxygen thereto. Specifically, the hydrogen concentration of the oxide semiconductor layer 144 is $5\times10^{19}$ atoms/cm$^3$ or less, preferably $5\times10^{18}$ atoms/cm$^3$ or less, further preferably $5\times10^{17}$ atoms/cm$^3$ or less, for example. Note that the above hydrogen concentration in the oxide semiconductor layer 144 is measured by secondary ion mass spectrometry (SIMS). The density of carriers generated due to a donor such as hydrogen in the oxide semiconductor layer 144, in which hydrogen is reduced to a sufficiently low concentration so that the oxide semiconductor layer is purified and in which defect states in an energy gap due to oxygen deficiency are reduced by sufficiently supplying oxygen as described above, is less than $1\times10^{12}$/cm$^3$, preferably less than $1\times10^{11}$/cm$^3$, further preferably less than $1.45\times10^{10}$/cm$^3$. In addition, for example, the off-state current (per unit channel width (1 μm), here) at room temperature (25° C.) is 100 zA (1 zA (zeptoampere) is $1\times10^{-21}$ A) or less, preferably 10 zA or less. In this manner, by using an i-type (intrinsic) or substantially i-type oxide semiconductor, the transistor having extremely favorable off-state current characteristics can be obtained.

In addition, a region which is part of a surface of the insulating layer 128 and is in contact with the oxide semiconductor layer 144 preferably has a root-mean-square (RMS) roughness of 1 nm or less. In this manner, the channel formation region of the second transistor 162 is provided in an extremely flat region having a root-mean-square (RMS) roughness of 1 nm or less, whereby the second transistor 162 which can prevent a malfunction such as a short-channel effect and has favorable characteristics can be provided even when the second transistor 162 is miniaturized.

The capacitor 164 in FIGS. 5A and 5B includes the source electrode 142a; the oxide semiconductor layer 144; the gate insulating layer 146; and an insulating layer 150 and an electrode 152 over the gate insulating layer 146. That is, the source electrode 142a functions as one electrode of the capacitor 164, and the electrode 152 functions as the other electrode of the capacitor 164. Note that a structure in which the gate insulating layer 146 is not provided in the capacitor 164 may also be employed. In such a structure, a dielectric layer of the capacitor 164 is formed of the oxide semiconductor layer 144 and the insulating layer 150, whereby the thickness of the dielectric layer can be reduced and the capacitance of the capacitor 164 can be increased.

Here, one electrode of the capacitor 164 in the (k−1)-th row (k is a natural number of greater than or equal to 2 and less than or equal to m) is the source electrode 142a of the second transistor 162 in the (k−1)-th row; therefore, the planar layout of the capacitor 164 can easily overlap with the planar layout of the second transistor 162; accordingly, the area occupied by the memory cells 190 can be reduced. The electrode 152 is formed over the insulating layer 150, whereby the gate electrodes 148 in the adjacent memory cells 190 can be formed with the minimum distance between wirings and the electrode 152 can be formed between the gate electrodes 148 of the adjacent memory cells 190. Therefore, the area occupied by the memory cells 190 can be reduced. Note that the electrode 152 functions as the word line WL in the circuit diagram of FIG. 1.

The insulating layer 150 is provided over the second transistor 162, and an insulating layer 154 is provided over the insulating layer 150 and the electrode 152 of the capacitor 164. In an opening formed in the gate insulating layer 146, the insulating layer 150, the insulating layer 154, and the like, an electrode 156a is provided. Over the insulating layer 154, a wiring 158 connected to the electrode 156a is formed. The wiring 158 is electrically connected to the metal compound region 124c functioning as a drain region of the first selection transistor 180 through an electrode 156b that is provided in the opening formed in the gate insulating layer 146, the insulating layer 150, the insulating layer 154, or the like; an electrode 142c; and an electrode 126 embedded in the insulating layer 128. Here, the wiring 158 functions as the bit line BL in the circuit diagram of FIG. 1.

With the above structure, the size of the planar layout of the memory cell 190 including the first transistor 160, the second transistor 162, and the capacitor 164 can be reduced. In the planar layout of the memory cell 190, the length in the row direction can be reduced as small as about the sum of the minimum width of the wiring 158 functioning as the bit line BL and the minimum distance between the wirings 158. In addition, in the planar layout of the memory cell 190, the length in the column direction can be reduced as small as about the sum of the minimum width of the gate electrode 148, the minimum distance between the gate electrodes 148, and the width of a formation region of one contact hole. When such a planar layout is employed, the degree of integration of the circuit in FIG. 1 can be increased. For example, when F is used to express the minimum feature size, the area occupied by the memory cell can be expressed as 6 $F^2$ to 18 $F^2$. Accordingly, the storage capacity per unit area of the semiconductor device can be increased.

Note that the structure of a semiconductor device according to an embodiment of the invention disclosed herein is not limited to that illustrated in FIGS. 5A and 5B. Since the technical idea of an embodiment of the invention disclosed herein is to form a stacked structure using an oxide semiconductor and a material other than an oxide semiconductor, the details such as an electrode connection can be changed as appropriate.

Next, an example of a manufacturing method of the above-described semiconductor device will be described. In the following description, first, a manufacturing method of the first transistor 160 and the first selection transistor 180 in the lower portion will be described, and then a manufacturing method of the second transistor 162 and the capacitor 164 in the upper portion will be described. Note that as for the second transistor 162, a manufacturing method of a TGBC transistor illustrated in FIGS. 5A and 5B will be described; however, a transistor having another structure can be manufactured using a similar material by changing the order of steps.

First, the substrate 100 including a semiconductor material is prepared. A single crystal semiconductor substrate or a polycrystalline semiconductor substrate of silicon, silicon carbide, or the like, a compound semiconductor substrate of silicon germanium or the like, an SOI substrate, or the like can be used as the substrate 100 including a semiconductor material. Here, an example of the case where a single crystal silicon substrate is used as the substrate 100 including a semiconductor material is described. Note that the term "SOI substrate" generally means a substrate where a silicon semiconductor layer is provided over an insulating surface. In this specification and the like, the term "SOI substrate" also means a substrate where a semiconductor layer including a material other than silicon is provided over an insulating surface. That is, a semiconductor layer included in the "SOI substrate" is not limited to a silicon semiconductor layer. Moreover, the SOI substrate can be a substrate having a structure in which a semiconductor layer is provided over an insulating substrate, such as a glass substrate, with an insulating layer interposed therebetween.

It is preferable that a single crystal semiconductor substrate of silicon or the like be particularly used as the substrate 100 including a semiconductor material because the speed of reading operation of the semiconductor device can be increased.

In order to control the threshold voltages of the transistors, an impurity element may be added to a region which later functions as the channel formation region 116a of the first transistor 160 and a region which later functions as the channel formation region 116b of the first selection transistor 180. Here, an impurity element imparting a conductivity type is added so that the threshold voltages of the first transistor 160 and the first selection transistor 180 that are p-channel transistors become negative. When the semiconductor material is silicon, the impurity imparting a conductivity type may be phosphorus, arsenic, antimony, or the like. Note that it is preferable to perform heat treatment after addition of the impurity element, in order to activate the impurity element or reduce defects which may be generated during addition of the impurity element.

Figure 6A:
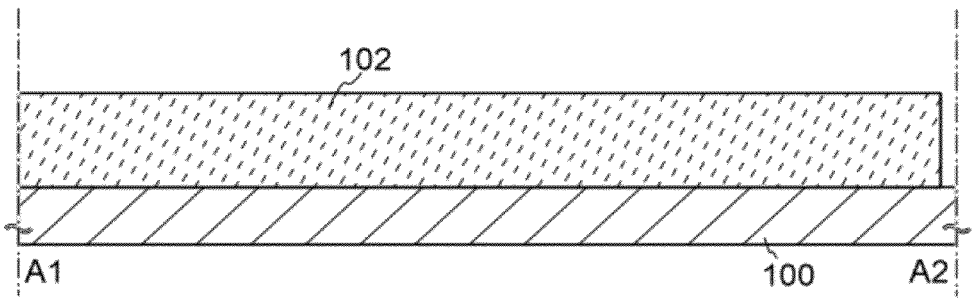
FIGS. 6A to 6D are cross-sectional views of a manufacturing process of a semiconductor device.

A protective layer 102 serving as a mask for forming an element isolation insulating layer is formed over the substrate 100 (see FIG. 6A). As the protective layer 102, an insulating layer formed using a material such as silicon oxide, silicon nitride, silicon oxynitride, or the like can be used, for example.

Figure 6B:
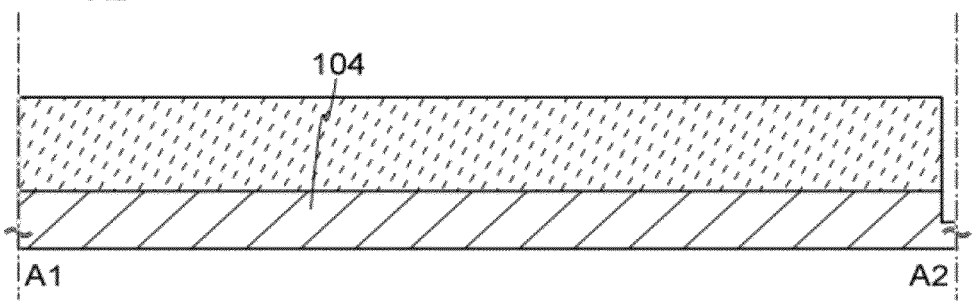

Next, part of the substrate 100 in a region not covered with the protective layer 102 (i.e., in an exposed region) is removed by etching using the protective layer 102 as a mask. Thus, a semiconductor region 104 isolated from the other semiconductor regions is formed (see FIG. 6B). As the etching, a dry etching method is preferably performed, but a wet etching method may be performed. An etching gas or an etchant can be selected as appropriate depending on a material to be etched.

Then, an insulating layer is formed so as to cover the substrate 100, and the insulating layer in a region overlapping with the semiconductor region 104 is selectively removed; thus, the element isolation insulating layer 106 is formed. The insulating layer is formed using silicon oxide, silicon nitride, silicon oxynitride, or the like. As a method for removing the insulating layer, any of etching treatment, polishing treatment such as chemical mechanical polishing (CMP) treatment, and the like can be employed. Note that the protective layer 102 is removed after the formation of the semiconductor region 104 or after the formation of the element isolation insulating layer 106.

Next, an insulating layer is formed over a surface of the semiconductor region 104, and a layer including a conductive material is formed over the insulating layer.

The insulating layer is processed into a gate insulating layer later and can be formed by, for example, heat treatment (thermal oxidation treatment, thermal nitridation treatment, or the like) of the surface of the semiconductor region 104. Instead of heat treatment, high-density plasma treatment may be employed. The high-density plasma treatment can be performed using, for example, a mixed gas of any of a rare gas such as helium, argon, krypton, or xenon, oxygen, nitrogen oxide, ammonia, nitrogen, hydrogen, and the like. It is needless to say that the insulating layer may be formed by a CVD method, a sputtering method, or the like. The insulating layer preferably has a single-layer structure or a stacked-layer structure with a film including silicon oxide, silicon oxynitride, silicon nitride, hafnium oxide, aluminum oxide, tantalum oxide, yttrium oxide, gallium oxide, hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), or the like. The insulating layer can have a thickness of 1 nm to 100 nm, preferably 10 nm to 50 nm, for example.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering method, or a spin coating method can be employed. Note that this embodiment shows an example of the case where the layer including a conductive material is formed using a metal material.

Figure 6C:
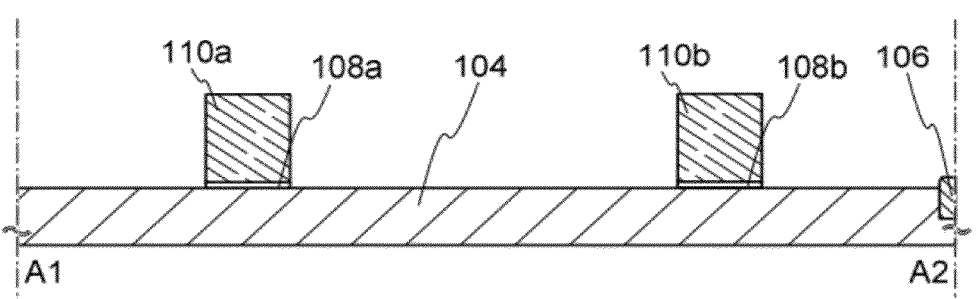

After that, the insulating layer and the layer including a conductive material are selectively etched; thus, the gate insulating layer 108 (the gate insulating layer 108a, the gate insulating layer 108b) and the gate electrode 110 (the gate electrode 110a, the gate electrode 110b) are formed (see FIG. 6C).

Figure 6D:
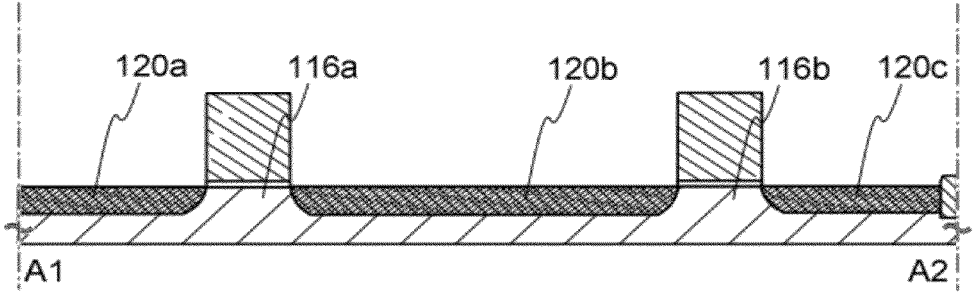

Next, boron (B), aluminum (Al), or the like is added to the semiconductor region 104, whereby the channel formation region 116 (the channel formation region 116a, the channel formation region 116b) and the impurity region 120 (the impurity region 120a, the impurity region 120b, the impurity region 120c) are formed (see FIG. 6D). Note that boron or aluminum is added here in order to form a p-channel transistor; an impurity element such as phosphorus (P) or arsenic (As) may be added in the case of forming an n-channel transistor. Here, the concentration of the impurity added can be set as appropriate; the concentration is preferably set high when a semiconductor element is highly miniaturized.

Note that a sidewall insulating layer may be formed around the gate electrode 110, and impurity regions to which the impurity element is added at different concentrations may be formed.

Next, a metal layer 122 is formed so as to cover the gate electrode 110, the impurity regions 120, and the like. The metal layer 122 can be formed by a variety of film formation methods such as a vacuum evaporation method, a sputtering method, and a spin coating method. The metal layer 122 is preferably formed using a metal material which forms a low-resistance metal compound by reacting with the semiconductor material contained in the semiconductor region 104. Examples of such metal materials are titanium, tantalum, tungsten, nickel, cobalt, platinum, and the like.

Figure 7A:
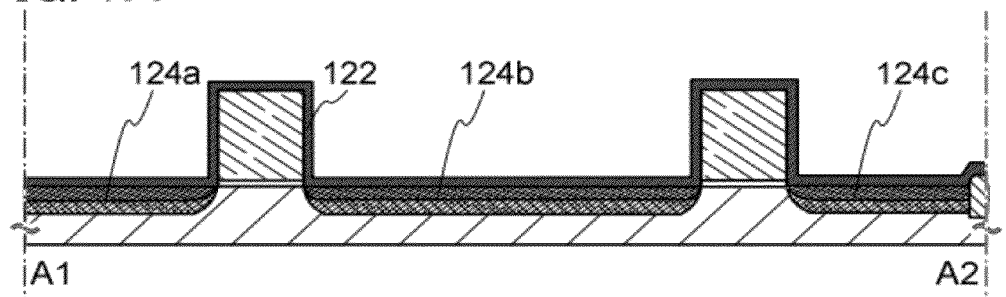
FIGS. 7A to 7D are cross-sectional views of the manufacturing process of a semiconductor device.

Next, heat treatment is performed so that the metal layer 122 reacts with the semiconductor material. Thus, the metal compound region 124 (the metal compound region 124a, the metal compound region 124b, the metal compound region 124c) which is in contact with the impurity region 120 (the impurity region 120a, the impurity region 120b, the impurity region 120c) are formed (see FIG. 7A). Note that when the gate electrode 110 is formed using polycrystalline silicon or the like, a metal compound region is also formed in a portion of the gate electrode 110 which is in contact with the metal layer 122.

As the heat treatment, irradiation with a flash lamp can be employed, for example. Although it is needless to say that another heat treatment method may be used, a method by which heat treatment can be finished in an extremely short time is preferably used in order to improve the controllability of chemical reaction for formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Next, an electrode 126 is formed in contact with the metal compound region 124c of the first selection transistor 180.

The electrode 126 is formed by forming a conductive layer by a PVD method such as a sputtering method, or a CVD method such as a plasma CVD method, and then by selectively etching the conductive layer. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, and scandium or a combination of a plurality of these elements may be used. The details are similar to those of the source electrode 142a, the drain electrode 142b, and the like to be described below.

Figure 7B:
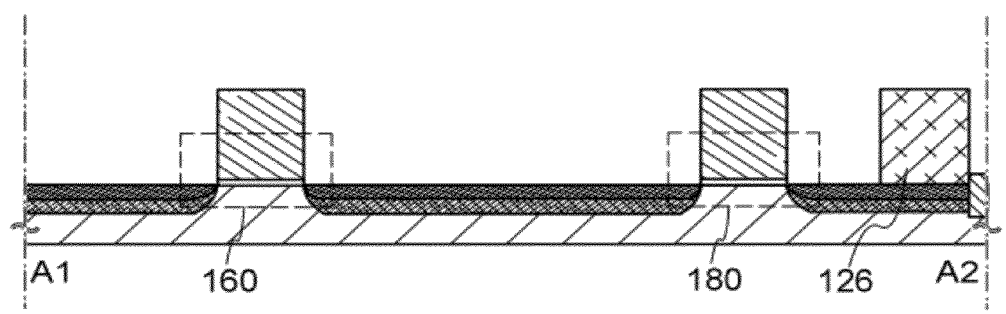

Through the above process, the first transistor 160 and the first selection transistor 180 are formed with the use of the substrate 100 including a semiconductor material (see FIG. 7B). A feature of the first transistor 160 is that it can operate at high speed. With the use of that transistor as a reading transistor, data can be read at high speed.

Figure 7C:
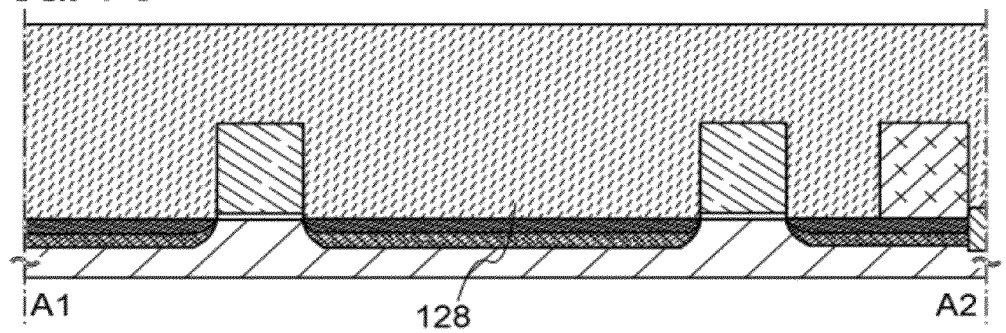

Next, the insulating layer 128 is formed so as to cover the components formed in the above steps (see FIG. 7C). The insulating layer 128 can be formed using an inorganic insulating material such as silicon oxide, silicon oxynitride, silicon nitride, or aluminum oxide. It is particularly preferable to use a low permittivity (low-k) material for the insulating layer 128 because capacitance due to overlap of electrodes or wirings can be sufficiently reduced. Note that a porous insulating layer with such a material may be employed as the insulating layer 128. A porous insulating layer has a lower permittivity than an insulating layer with high density, and thus allows a further reduction in capacitance generated by electrodes or wirings. Alternatively, the insulating layer 128 can be formed using an organic insulating material such as polyimide or acrylic. Note that although the insulating layer 128 has a single-layer structure in this embodiment, an embodiment of the disclosed invention is not limited to this example. The insulating layer 128 may have a stacked structure including two or more layers.

Figure 7D:
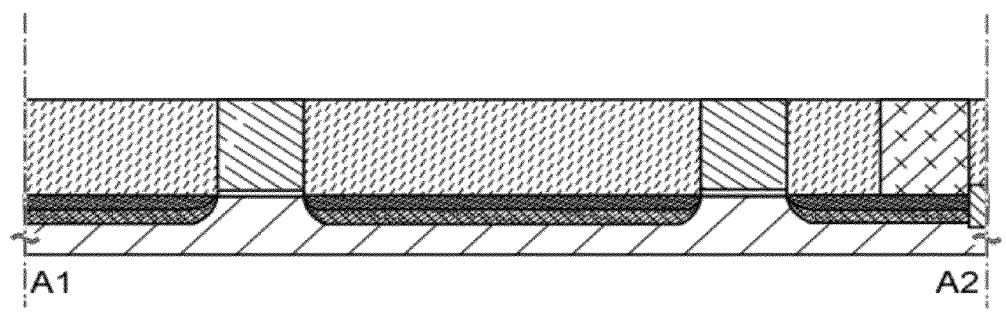

After that, as treatment performed before the second transistor 162 and the capacitor 164 are formed, CMP treatment of the insulating layer 128 is performed so that upper surfaces of the gate electrode 110a, the gate electrode 110b, and the electrode 126 are exposed (see FIG. 7D). As the treatment for exposing the upper surface of the gate electrode 110, etching treatment may be employed as an alternative to CMP treatment. Note that it is preferable to planarize the surface of the insulating layer 128 as much as possible in order to improve the characteristics of the second transistor 162. For example, the surface of the insulating layer 128 preferably has a root-mean-square (RMS) roughness of 1 nm or less.

Note that before or after each of the above steps, a step of forming an electrode, a wiring, a semiconductor layer, an insulating layer, or the like may be further performed. For example, when the wiring has a multilayer wiring structure of a stacked structure including insulating layers and conductive layers, a highly integrated semiconductor device can also be realized.

Figure 8A:
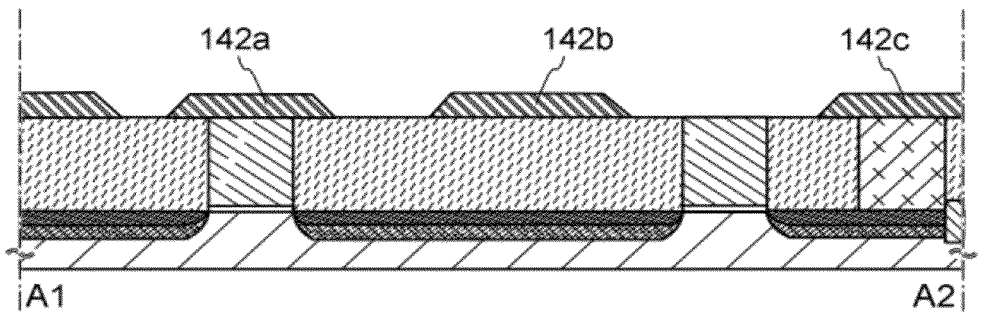
FIGS. 8A to 8D are cross-sectional views of the manufacturing process of a semiconductor device.

Next, a conductive layer is formed over the gate electrode 110, the electrode 126, the insulating layer 128, and the like, and the source electrode 142a, the drain electrode 142b, and the drain electrode 142c are formed by selectively etching the conductive layer (see FIG. 8A).

The conductive layer can be formed by a PVD method such as a sputtering method, or a CVD method such as a plasma CVD method. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, and scandium or a combination of a plurality of these elements may be used.

The conductive layer may have a single-layer structure or a stacked structure including two or more layers. For example, the conductive layer may have a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, or the like. Note that the conductive layer having a single-layer structure of a titanium film or a titanium nitride film has an advantage in that it can be easily processed into the source electrode 142a, the drain electrode 142b, and the electrode 142c having a tapered shape.

The conductive layer may be formed using a conductive metal oxide. As the conductive metal oxide, indium oxide, tin oxide, zinc oxide, indium tin oxide (abbreviated to ITO in some cases), indium zinc oxide, or any of these metal oxide materials including silicon or aluminum can be used.

Although either dry etching or wet etching may be performed as the etching of the conductive layer, dry etching which has high controllability is preferably used for miniaturization. The etching may be performed so that the source electrode 142a and the drain electrode 142b have a tapered shape. The taper angle can be in the range of, 30° to 60°, for example.

The channel length (L) of the second transistor 162 in the upper portion is determined by a distance between upper edge portions of the source electrode 142a and the drain electrode 142b. Note that for light exposure for forming a mask in the case of manufacturing a transistor with a channel length (L) of less than 25 nm, light exposure is preferably performed with extreme ultraviolet light whose wavelength is as extremely short as several nanometers to several tens of nanometers. The resolution of light exposure with extreme ultraviolet light is high and the depth of focus is large. For these reasons, the channel length (L) of the transistor to be formed later can be set to less than 2 μm, preferably in the range of 10 nm to 350 nm (0.35 μm), in which case the circuit can operate at higher speed.

Note that an insulating layer functioning as a base insulating layer may be provided over the insulating layer 128. The insulating layer can be formed by a PVD method, a CVD method, or the like.

Figure 8B:
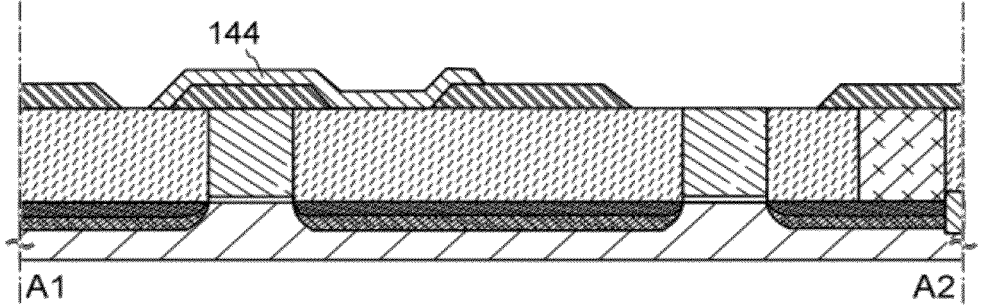

Next, the oxide semiconductor layer 144 is formed by forming an oxide semiconductor layer so as to be in contact with part of upper surfaces of the source electrode 142a, the drain electrode 142b, and the insulating layer 128 and then by selectively etching the oxide semiconductor layer (see FIG. 8B).

An oxide semiconductor to be used preferably contains at least indium (In) or zinc (Zn). In particular, In and Zn are preferably contained. As a stabilizer for reducing change in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

An In—Ga—Zn-based oxide semiconductor material has sufficiently high resistance when there is no electric field and thus off-state current can be sufficiently reduced. In addition, the In—Ga—Zn-based oxide semiconductor material has a high field-effect mobility. In a transistor including an In—Sn—Zn-based oxide semiconductor material, the field-effect mobility can be three times or more as high as that of a transistor including the In—Ga—Zn-based oxide semiconductor material, and the threshold voltage can be easily set to be positive. These semiconductor materials are one of the materials that can be favorably used in a transistor of a semiconductor device according to an embodiment of the present invention.

Note that here, for example, an "In—Ga—Zn-based oxide" means an oxide containing In, Ga, and Zn as its main component, in which there is no particular limitation on the ratio of In:Ga:Zn. In addition to In, Ga, and Zn, a metal element may be contained.

As the oxide semiconductor, a material expressed by a chemical formula, $InMO_3(ZnO)_m$ (m>0, m is not an integer) may be used. Here, M represents one or more metal elements selected from Ga, Fe, Mn, or Co. Alternatively, as the oxide semiconductor, a material expressed by a chemical formula, $In_3SnO_5(ZnO)_n$ (n>0, n is an integer) may be used. For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having the appropriate composition may be used depending on necessary semiconductor characteristics (e.g., mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced, and relatively high mobility can be obtained relatively easily.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, further preferably less than or equal to 0.1 nm.

Note that the average surface roughness ($R_a$) is obtained by expanding, into three dimensions, center line average roughness that is defined by JIS B 0601 so as to be able to apply it to a measurement surface. The $R_a$ can be expressed as an "average value of the absolute values of deviations from a reference surface to a designated surface" and is defined by the following formula.

$$Ra = \frac{1}{S_0}\int_{x_2}^{x_1}\int_{y_2}^{y_1} |f(x,y) - Z_0| dx dy \quad \{\text{FORMULA 1}\}$$

In the above formula, $S_0$ represents the area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

The target for forming the oxide semiconductor layer 144 by a sputtering method is, for example, an oxide target containing $In_2O_3$, $Ga_2O_3$, and ZnO in a composition ratio (molar ratio) of 1:1:1. Alternatively, an oxide target having a composition ratio of $In_2O_3$:$Ga_2O_3$:ZnO=1:1:2 [molar ratio] may be used.

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn-based oxide semiconductor which has an atomic ratio of In:Zn:O=X:Y:Z, the relation of Z>1.5X+Y is satisfied.

Further, an In—Sn—Zn-based oxide can be referred to as ITZO. An oxide target which has a composition ration of In:Sn:Zn=1:2:2, 2:1:3, 1:1:1, 20:45:35, or the like in an atomic ratio is used.

Here, as the oxide semiconductor having crystallinity, an oxide including a crystal with c-axis alignment (also referred to as C-Axis Aligned Crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, a oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal oxide, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 11A to 11E, FIGS. 12A to 12C, and FIGS. 13A to 13C. In FIGS. 11A to 11E, FIGS. 12A to 12C, and FIGS. 13A to 13C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 11A to 11E, O surrounded by a circle represents tetracoodianate O and O surrounded by a double circle represents tricoodenate O.

Figure 11A:
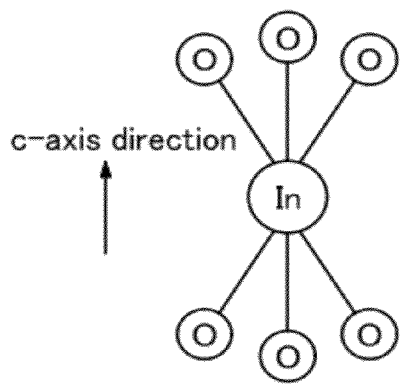
FIGS. 11A to 11E show crystal structures of oxide materials.

FIG. 11A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 11A is actually an octahedral structure, but is illustrated as a planar structure for simplicity. Note that three tetracoordinate O atoms exist in each of an upper half and a lower half in FIG. 11A. In the small group illustrated in FIG. 11A, electric charge is 0.

Figure 11D:
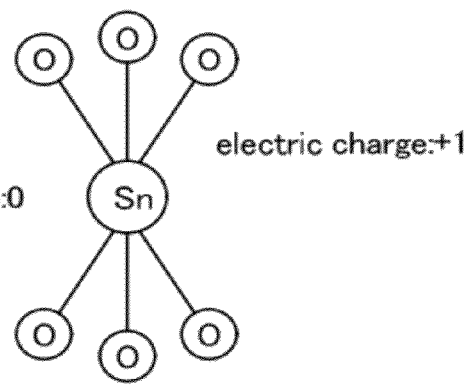
Figure 11B:
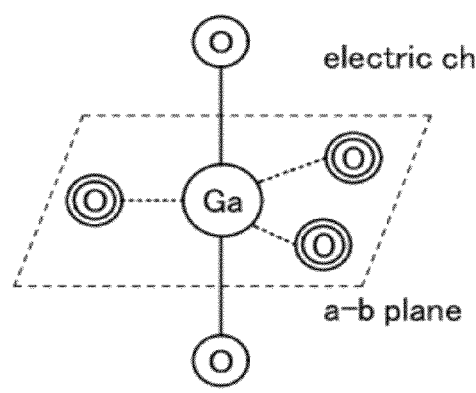

FIG. 11B illustrates a structure including one pentacoordinate Ga atom, three tricoordinate oxygen (hereinafter referred to as tricoordinate 0) atoms proximate to the Ga atom, and two tetracoordinate O atoms proximate to the Ga atom. All the tricoordinate O atoms exist in the a-b plane. One tetracoordinate O atom exists in each of an upper half and a lower half in FIG. 11B. An In atom can also have the structure illustrated in FIG. 11B because an In atom can have five ligands. In the small group illustrated in FIG. 11B, electric charge is 0.

Figure 11E:
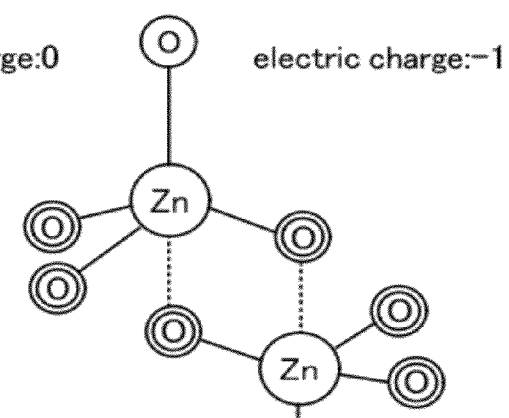
Figure 11C:
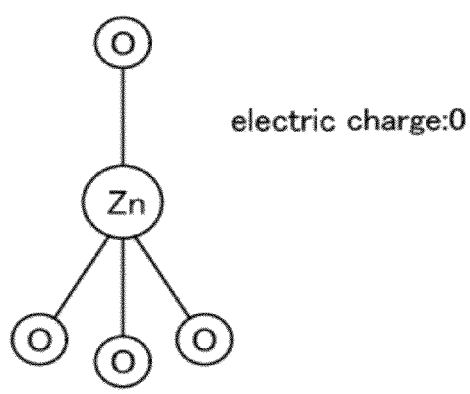

FIG. 11C illustrates a structure including one tetracoordinate Zn atom and four tetracoordinate O atoms proximate to the Zn atom. In FIG. 11C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 11C. In the small group illustrated in FIG. 11C, electric charge is 0.

FIG. 11D illustrates a structure including one hexacoordinate Sn atom and six tetracoordinate O atoms proximate to the Sn atom. In FIG. 11D, three tetracoordinate O atoms exist in each of an upper half and a lower half. In the small group illustrated in FIG. 11D, electric charge is +1.

FIG. 11E illustrates a small group including two Zn atoms. In FIG. 11E, one tetracoordinate O atom exists in each of an upper half and a lower half. In the small group illustrated in FIG. 11E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 11A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 12A illustrates a model of a medium group included in a layered structure of an In—Sn—Zn—O-based material. FIG. 12B illustrates a large group including three medium groups. Note that FIG. 12C illustrates an atomic arrangement in the case where the layered structure in FIG. 12B is observed from the c-axis direction.

In FIG. 12A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 12A, one tetracoordinate O atom existing in each of an upper half and a lower half with respect to an In atom is denoted by circled 1. FIG. 12A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 12A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 11E can be given. For example, with one small group including two Zn atoms, electric charge of one small group including a Sn atom can be cancelled, so that the total electric charge of the layered structure can be 0.

When the large group illustrated in FIG. 12B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figures 13A, 13B, 13C:
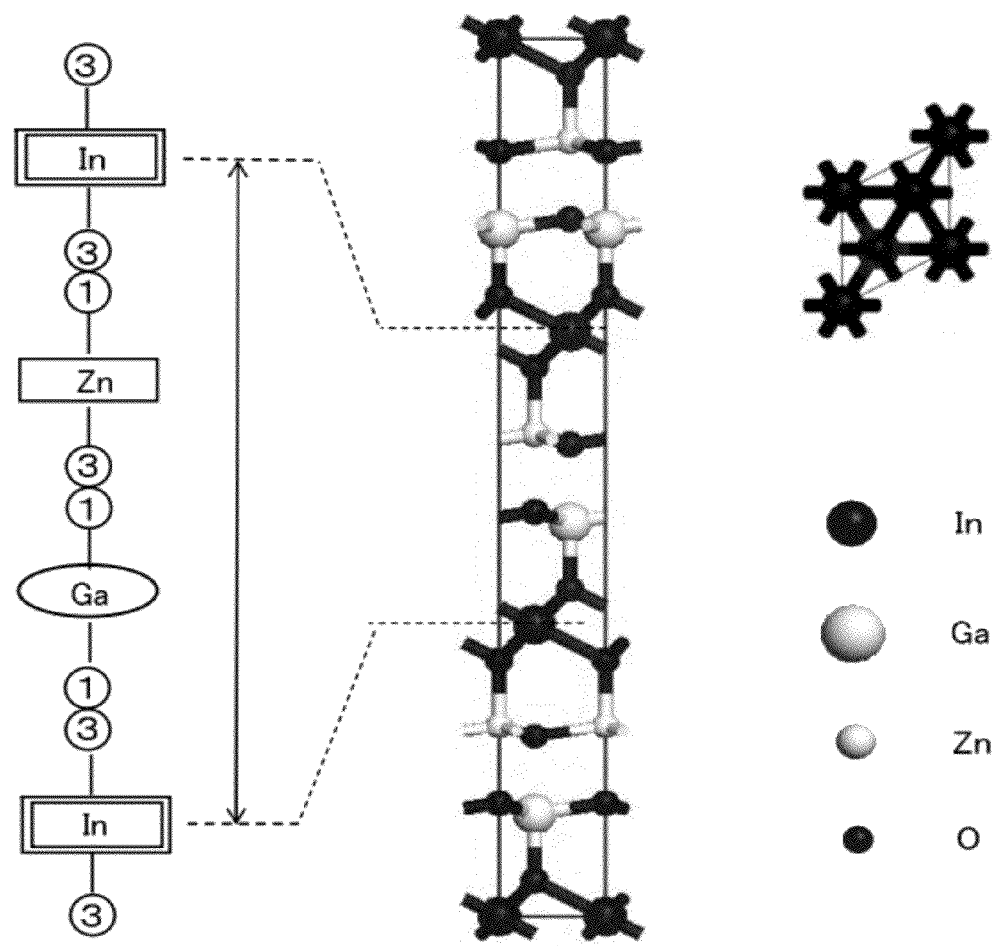
FIGS. 13A to 13C show a crystal structure of an oxide material.

As an example, FIG. 13A illustrates a model of a medium group included in a layered structure of an In—Ga—Zn—O-based material.

In the medium group included in the layered structure of the In—Ga—Zn—O-based material in FIG. 13A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 13B illustrates a large group including three medium groups. Note that FIG. 13C illustrates an atomic arrangement in the case where the layered structure in FIG. 13B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 13A but also a medium group in which the arrangement of the In atom, the Ga atom, and the Zn atom is different from that in FIG. 13A.

In this embodiment, an oxide semiconductor layer having an amorphous structure is formed as the oxide semiconductor layer 144 by a sputtering method with the use of an In—Ga—Zn-based metal oxide target. The thickness ranges from 1 nm to 50 nm, preferably from 2 nm to 20 nm, further preferably from 3 nm to 15 nm.

The relative density of the metal oxide in the metal oxide target is 80% or more, preferably 95% or more, and further preferably 99.9% or more. The use of the metal oxide target with high relative density makes it possible to form an oxide semiconductor layer having a dense structure.

The atmosphere in which the oxide semiconductor layer 144 is formed is preferably a rare gas (typically, argon) atmosphere, an oxygen atmosphere, or a mixed atmosphere containing a rare gas (typically, argon) and oxygen. Specifically, it is preferable to use a high-purity gas atmosphere, for example, from which an impurity such as hydrogen, water, a hydroxyl group, or hydride is removed to a concentration of 1 ppm or less (preferably, a concentration of 10 ppb or less).

In forming the oxide semiconductor layer 144, for example, an object to be processed is held in a treatment chamber that is maintained under reduced pressure, and the object to be processed is heated to a temperature higher than or equal to 100° C. and lower than 550° C., preferably higher than or equal to 200° C. and lower than or equal to 400° C. Alternatively, the temperature of an object to be processed in forming the oxide semiconductor layer 144 may be room temperature (higher than or equal to 15° C. and lower than or equal to 35° C.). Then, moisture in the treatment chamber is removed, a sputtering gas from which hydrogen, water, or the like is removed is introduced, and the above-described target is used; thus, the oxide semiconductor layer 144 is formed. By forming the oxide semiconductor layer 144 while heating the object to be processed, an impurity in the oxide semiconductor layer 144 can be reduced. Moreover, damage due to sputtering can be reduced. In order to remove the moisture from the treatment chamber, it is preferable to use an entrapment vacuum pump. For example, a cryopump, an ion pump, a titanium sublimation pump, or the like can be used. A turbomolecular pump provided with a cold trap may be used. Since hydrogen, water, or the like can be removed from the treatment chamber evacuated with a cryopump or the like, the concentration of an impurity in the oxide semiconductor layer can be reduced.

For example, conditions for forming the oxide semiconductor layer 144 can be set as follows: the distance between the object to be processed and the target is 170 mm; the pressure is 0.4 Pa; the direct current (DC) power is 0.5 kW; and the atmosphere is an oxygen (100% oxygen) atmosphere, an argon (100% argon) atmosphere, or a mixed atmosphere of oxygen and argon. Note that a pulsed direct current (DC) power source is preferably used because dust (such as powder substances generated in film formation) can be reduced and the film thickness can be made uniform. The thickness of the oxide semiconductor layer 144 is set in the range of 1 nm to 50 nm, preferably 2 nm to 20 nm, further preferably 3 nm to 15 nm. By employing a structure according to the disclosed invention, a short-channel effect due to miniaturization can be suppressed even in the case of using the oxide semiconductor layer 144 having such a thickness. Note that the appropriate thickness of the oxide semiconductor layer differs depending on the oxide semiconductor material to be used, the intended use of the semiconductor device, or the like; therefore, the thickness can be determined as appropriate in accordance with the material, the intended use, or the like. Note that as illustrated in FIG. 8B, a portion corresponding to the channel formation region in the oxide semiconductor layer 144 preferably has a planar cross-sectional shape. By making the cross-sectional shape of the portion corresponding to the channel formation region in the oxide semiconductor layer 144 flat, leakage current can be reduced as compared to the case where the cross-sectional shape of the oxide semiconductor layer 144 is not flat.

Note that before the oxide semiconductor layer 144 is formed by a sputtering method, reverse sputtering in which plasma is generated with an argon gas introduced may be performed so that a material attached to a formation surface is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface side in an argon atmosphere so that plasma is generated near the object to be processed. Note that an atmosphere of nitrogen, helium, oxygen, or the like may be used instead of an argon atmosphere.

After formation of the oxide semiconductor layer 144, heat treatment (first heat treatment) is preferably performed on the oxide semiconductor layer 144. Through the first heat treatment, excess hydrogen (including water or a hydroxyl group as well) in the oxide semiconductor layer 144 can be removed, the structure of the oxide semiconductor layer 144 can be ordered, and defect states in an energy gap can be reduced. For example, the temperature of the first heat treatment can be set higher than or equal to 300° C. and lower than 550° C., preferably higher than or equal to 400° C. and lower than or equal to 500° C.

For example, after an object to be processed is introduced into an electric furnace including a resistance heater or the like, the heat treatment can be performed at 450° C. for one hour in a nitrogen atmosphere. The oxide semiconductor layer is not exposed to the air during the heat treatment so that entry of water or hydrogen can be prevented.

The heat treatment apparatus is not limited to the electric furnace and may be an apparatus for heating an object to be processed by thermal radiation or thermal conduction from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, GRTA treatment may be performed as follows. The object to be processed is put in a heated inert gas atmosphere, heated for several minutes, and taken out of the inert gas atmosphere. The GRTA treatment enables high-temperature heat treatment in a short time. Moreover, the GRTA treatment can be employed even when the temperature exceeds the upper temperature limit of the object to be processed. Note that the inert gas is preferably switched to a gas including oxygen during the treatment. This is because by performing the first heat treatment in an atmosphere including oxygen, the oxide semiconductor layer becomes in an oxygen-excess state and accordingly donor states in an energy gap caused by oxygen vacancies can be reduced.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or less, preferably 0.1 ppm or less).

By reducing an impurity through the first heat treatment and making the oxide semiconductor layer in an oxygen-excess state in the above-described manner, an oxide semiconductor layer which is an i-type (intrinsic) or substantially i-type oxide semiconductor layer can be obtained, which can realize a transistor with extremely excellent characteristics.

The above heat treatment (the first heat treatment) can also be referred to as dehydration treatment, dehydrogenation treatment, or the like because it has the effect of removing hydrogen, water, or the like. The dehydration treatment, the dehydrogenation treatment, or the heat treatment in an atmosphere including oxygen can be performed after the oxide semiconductor layer 144 is formed, after the gate insulating layer 146 is formed later, or after a gate electrode is formed. Such dehydration treatment, dehydrogenation treatment, or heat treatment in an atmosphere including oxygen may be conducted once or plural times.

The etching of the oxide semiconductor layer 144 may be performed either before the heat treatment or after the heat treatment. A dry etching method is preferably used in terms of element miniaturization, but a wet etching method may be used. An etching gas or an etchant can be selected as appropriate depending on a material to be etched. Note that in the case where leakage in an element or the like does not cause a problem, the oxide semiconductor layer does not necessarily need to be processed in an island shape.

Next, the gate insulating layer 146 is formed so as to cover the oxide semiconductor layer 144.

The gate insulating layer 146 can be formed by a CVD method, a sputtering method, or the like. The gate insulating layer 146 is preferably formed so as to contain silicon oxide, silicon nitride, silicon oxynitride, aluminum oxide, gallium oxide, tantalum oxide, hafnium oxide, yttrium oxide, hafnium silicate ($HfSi_xO_y$ ($x>0$, $y>0$)), hafnium silicate to which nitrogen is added ($HfSi_xO_yN_z$ ($x>0$, $y>0$, $z>0$)), hafnium aluminate to which nitrogen is added ($HfAl_xO_yN_z$ ($x>0$, $y>0$, $z>0$)), or the like. The gate insulating layer 146 may have a single-layer structure or a stacked structure. There is no particular limitation on the thickness of the gate insulating layer 146; the thickness is preferably small in order to ensure the operation of the transistor when the semiconductor device is miniaturized. For example, in the case of using silicon oxide, the thickness can be in the range of 1 nm to 100 nm, preferably 10 nm to 50 nm.

When the gate insulating layer is thin as described above, gate leakage due to a tunneling effect or the like becomes a problem. In order to solve the problem of gate leakage, the gate insulating layer 146 may be formed using a high permittivity (high-k) material such as hafnium oxide, tantalum oxide, yttrium oxide, gallium oxide, hafnium silicate ($HfSi_xO_y$ ($x>0$, $y>0$)), hafnium silicate to which nitrogen is added ($HfSi_xO_yN_z$ ($x>0$, $y>0$, $z>0$)), or hafnium aluminate to which nitrogen is added ($HfAl_xO_yN_z$ ($x>0$, $y>0$, $z>0$)). The use of a high-k material for the gate insulating layer 146 makes it possible to increase the thickness in order to suppress gate leakage as well as ensuring electrical properties. For example, the relative permittivity of hafnium oxide is approximately 15, which is much higher than that of silicon oxide which is 3 to 4. With such a material, a gate insulating layer where the equivalent oxide thickness is less than 15 nm, preferably 2 nm to 10 nm, can be easily formed. Note that a stacked structure of a film including a high-k material and a film including any of silicon oxide, silicon nitride, silicon oxynitride, silicon nitride oxide, aluminum oxide, and the like may also be employed.

After the gate insulating layer 146 is formed, second heat treatment is preferably performed in an inert gas atmosphere or an oxygen atmosphere. The temperature of the heat treatment is set in the range of 200° C. to 450° C., preferably 250° C. to 350° C. For example, the heat treatment may be performed at 250° C. for one hour in a nitrogen atmosphere. By the second heat treatment, variation in electrical characteristics of the transistor can be reduced. In the case where the gate insulating layer 146 contains oxygen, oxygen can be supplied to the oxide semiconductor layer 144 and oxygen vacancies in the oxide semiconductor layer 144 can be filled; thus, the oxide semiconductor layer which is i-type (intrinsic) or substantially i-type can also be formed.

Note that the second heat treatment is performed in this embodiment after the gate insulating layer 146 is formed; there is no limitation on the timing of the second heat treatment. For example, the second heat treatment may be performed after the gate electrode is formed. Alternatively, the first heat treatment and the second heat treatment may be performed in succession, or the first heat treatment may double as the second heat treatment, or the second heat treatment may double as the first heat treatment.

By performing at least one of the first heat treatment and the second heat treatment as described above, the oxide semiconductor layer 144 can be purified so as to contain impurities other than main components as little as possible.

Figure 8C:
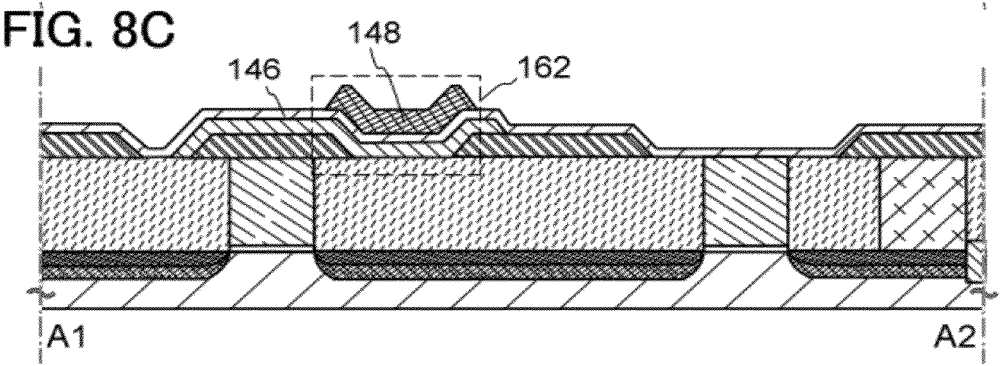

Next, the gate electrode 148 is formed over the gate insulating layer 146 (see FIG. 8C).

The gate electrode 148 can be formed by forming a conductive layer over the gate insulating layer 146 and then by selectively etching the conductive layer. The conductive layer to be the gate electrode 148 can be formed by a PVD method such as a sputtering method, or a CVD method such as a plasma CVD method. The details are similar to those in the case of the source electrode 142a, the drain electrode 142b, or the like; thus, the description thereof can be referred to.

Through the above steps, the second transistor 162 including the oxide semiconductor layer 144, which is purified, is completed. The second transistor 162 as described above has the feature of sufficiently small off-state current. Therefore, with the use of the transistor as a writing transistor, charge can be held for a long time.

Then, the insulating layer 150 is formed over the gate insulating layer 146 and the gate electrode 148. The insulating layer 150 can be formed by a PVD method, a CVD method, or the like. The insulating layer 150 can be formed so as to have a single-layer structure or a stacked structure using a material including an inorganic insulating material such as silicon oxide, silicon oxynitride, silicon nitride, hafnium oxide, aluminum oxide which is expressed by $Ga_xAl_{2-x}O_{3+y}$ ($0 \leq x \leq 2$, $0 < y < 1$, the value of x is greater than or equal to 0 and smaller than or equal to 2, the value of y is greater than or equal to 0 and smaller than or equal to 1), gallium oxide, aluminum gallium oxide, or the like.

Note that the insulating layer 150 is preferably formed using a low permittivity material or a low permittivity structure (such as a porous structure). This is because when the insulating layer 150 has a low permittivity, capacitance generated between wirings, electrodes, or the like can be reduced and operation at higher speed can be achieved.

Note that in the case where a structure is employed in which the capacitor 164 does not include the gate insulating layer 146, the gate insulating layer 146 over the source electrode 142a and in a region where the capacitor 164 is to be formed may be removed before the insulating layer 150 is formed.

Figure 8D:
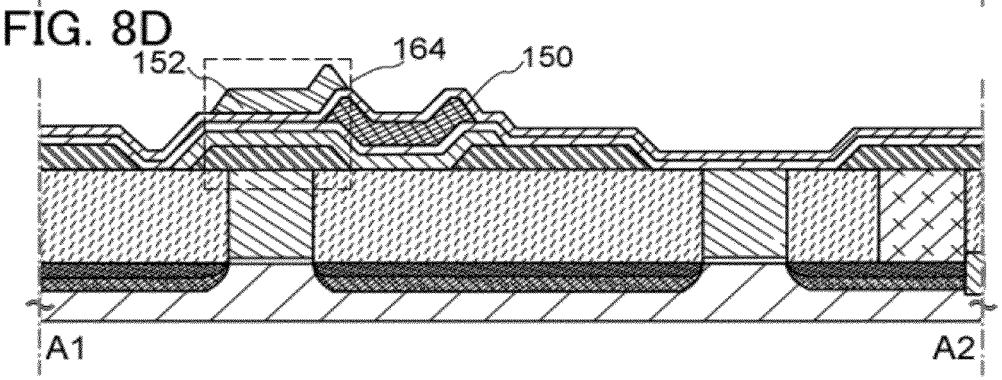

Next, the electrode 152 is formed over the insulating layer 150 so as to overlap with the source electrode 142a (see FIG. 8D). The method and materials for forming the gate electrode 148 can be applied to the electrode 152; therefore, the description of the gate electrode 148 can be referred to for the details of the electrode 152. Through the above steps, the capacitor 164 is completed.

Figure 9A:
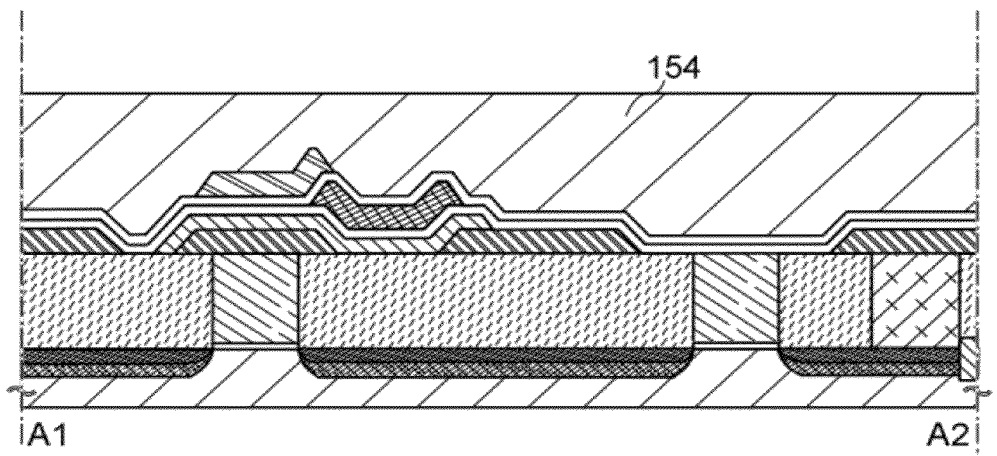
FIGS. 9A to 9C are cross-sectional views of the manufacturing process of a semiconductor device.

Next, the insulating layer 154 is formed over the insulating layer 150 and the electrode 152 (see FIG. 9A). Like the insulating layer 150, the insulating layer 154 can be formed by a PVD method, a CVD method, or the like. The insulating layer 154 can be formed so as to have a single-layer structure or a stacked structure using a material including an inorganic insulating material such as silicon oxide, silicon oxynitride, silicon nitride, hafnium oxide, or aluminum oxide.

Note that the insulating layer 154 is preferably formed using a low permittivity material or a low permittivity structure (such as a porous structure). This is because when the insulating layer 154 has a low dielectric constant, capacitance generated between wirings, electrodes, or the like can be reduced and operation at higher speed can be achieved.

Note that the insulating layer 154 is desirably formed so as to have a flat surface. This is because when the insulating layer 154 has a flat surface, an electrode, a wiring, or the like can be favorably formed over the insulating layer 154 even in the case where the semiconductor device or the like is miniaturized. Note that the insulating layer 154 can be planarized using a method such as chemical mechanical polishing (CMP).

Figure 9B:
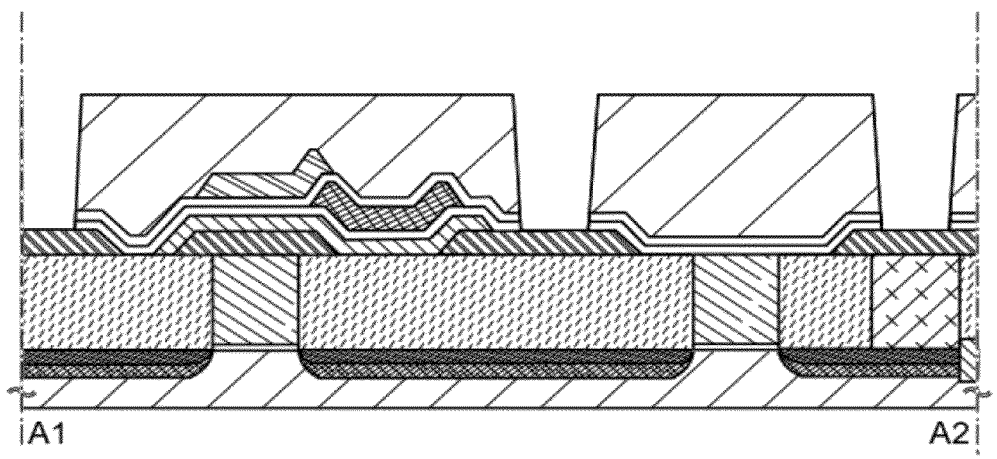
Figure 9C:
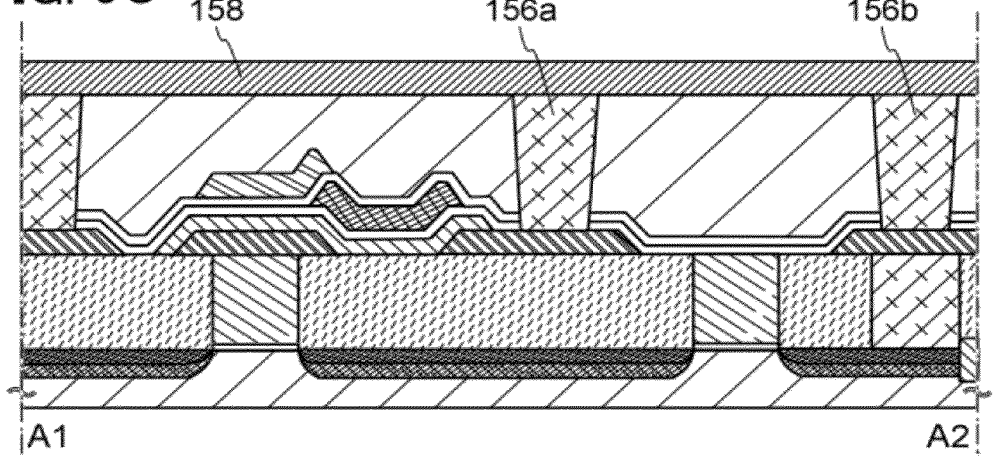

Next, an opening reaching the drain electrode 142b and an opening reaching the electrode 142c are formed in the gate insulating layer 146, the insulating layer 150, and the insulating layer 154 (see FIG. 9B). Then, the electrode 156a and the electrode 156b are formed in the openings and the wiring 158 in contact with the electrode 156a and the electrode 156b is formed over the insulating layer 154 (see FIG. 9C). The openings are formed by selective etching with a mask or the like.

The electrode 156a and the electrode 156b can be formed in such a manner, for example, that a conductive layer is formed in regions including the openings by a PVD method, a CVD method, or the like and then part of the conductive layer is removed by etching, CMP, or the like.

Specifically, it is possible to employ a method, for example, in which a thin titanium film is formed in a region including the opening by a PVD method and a thin titanium nitride film is formed by a CVD method, and then, a tungsten film is formed so as to be embedded in the opening. Here, the titanium film formed by a PVD method functions to reduce an oxide film (e.g., a natural oxide film) formed on a surface where the titanium film is formed, and to decrease the contact resistance with a lower electrode or the like (here, the drain electrode 142b). The titanium nitride film formed after the formation of the titanium film has a barrier function for suppressing diffusion of the conductive material. A copper film may be formed by a plating method after the formation of a barrier film of titanium, titanium nitride, or the like.

The wiring 158 is formed by forming a conductive layer by a PVD method such as a sputtering method or a CVD method such as a plasma CVD method, and then by selectively etching the conductive layer. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, and scandium or a combination of a plurality of these elements may be used. The details are similar to those of the source electrode 142a and the like.

Note that a variety of wirings, electrodes, or the like may be formed after the above steps. The wirings or the electrodes can be formed by a method such as a so-called damascene method or dual damascene method.

Through the above steps, the semiconductor device having the structure illustrated in FIGS. 5A and 5B can be manufactured.

In the second transistor 162 described in this embodiment, the oxide semiconductor layer 144 is purified and thus contains hydrogen at a concentration of $5 \times 10^{19}$ atoms/cm$^3$ or less, preferably 5×10$^{18}$ atoms/cm$^3$ or less, further preferably 5×10$^{17}$ atoms/cm$^3$ or less. In addition, the carrier density of the oxide semiconductor layer 144 is, for example, less than 1×10$^{12}$/cm$^3$, preferably less than 1.45×10$^{10}$/cm$^3$, which is sufficiently lower than the carrier density of a general silicon wafer (approximately 1×10$^{14}$/cm$^3$). In addition, the off-state current of the second transistor 162 is sufficiently small. For example, the off-state current (per unit channel width (1 μm), here) of the second transistor 162 at room temperature (25° C.) is 100 zA (1 zA (zeptoampere) is 1×10$^{-21}$ A) or less, preferably 10 zA or less.

In this manner, by using the oxide semiconductor layer 144 which is purified and is intrinsic, it becomes easy to sufficiently reduce the off-state current of the second transistor 162. With the use of such a transistor as described above, a semiconductor device in which stored data can be held for an extremely long time can be provided.

The configurations, methods, and the like described in this embodiment can be combined as appropriate with any of the configurations, methods, and the like described in the other embodiments.

Embodiment 3

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \quad \text{[FORMULA 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \quad \text{[FORMULA 3]}$$

Here, e represents the elementary charge, N represents the average defect density per unit area in a channel, $\in$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \quad \text{[FORMULA 4]}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} \quad \text{[FORMULA 5]}$$
$$= \ln\left(\frac{W \mu V_d C_{ox}}{L}\right) - \frac{e^3 N^2 t}{8 k T \varepsilon C_{ox} V_g}$$

The right side of Formula 5 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately 1×10$^{12}$/cm$^2$.

On the basis of the defect density obtained in this manner, or the like, $\mu_0$ can be calculated to be 120 cm$^2$/Vs from Formula 2 and Formula 3. The measured mobility of an In—Sn—Zn oxide including a defect is approximately 40 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B} \exp\left(-\frac{x}{l}\right) \quad \text{[FORMULA 6]}$$

Here, D represents the electric field in the gate direction, and B and l are constants. B and l can be obtained from actual measurement results; according to the above measurement results, B is 4.75×10$^7$ cm/s and l is 10 nm (the depth to which the influence of interface scattering reaches). When D is increased (i.e., when the gate voltage is increased), the second term of Formula 6 is increased and accordingly the mobility $\mu_1$ is decreased.

Figure 14:
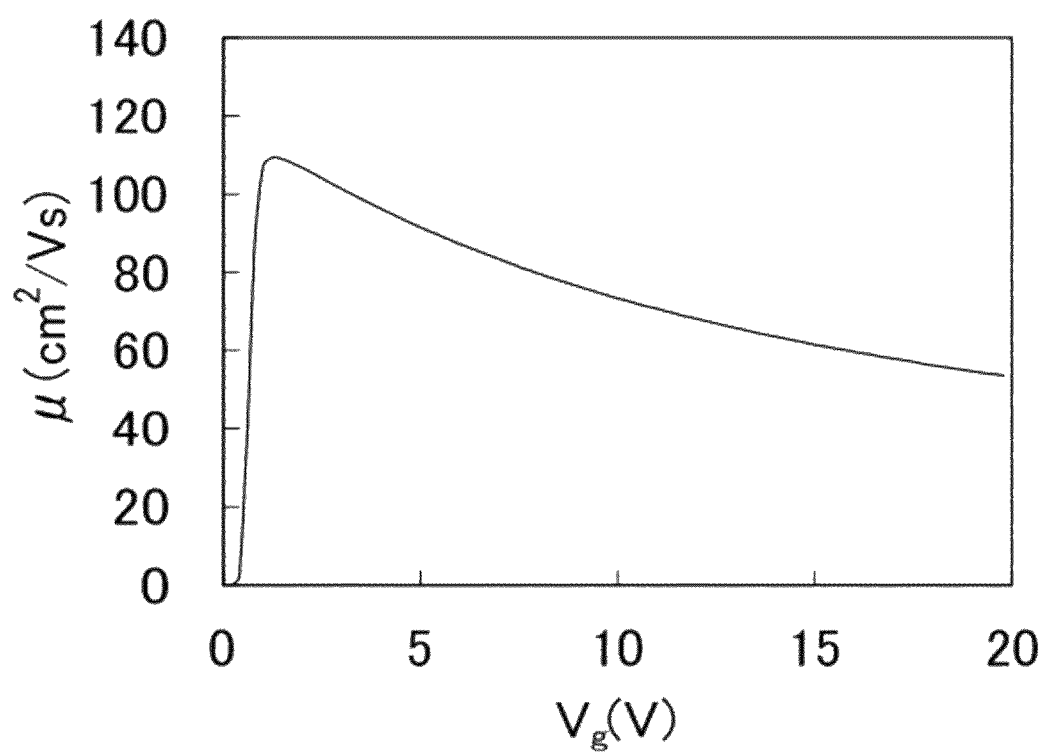
FIG. 14 shows the gate voltage dependence of mobility obtained by calculation.

Calculation results of the mobility $\mu_2$ of a transistor whose channel includes an ideal oxide semiconductor without a defect inside the semiconductor are shown in FIG. 14. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively.

The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 14, the mobility has a peak of more than 100 cm²/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 15A to 15C, FIGS. 16A to 16C, and FIGS. 17A to 17C. FIGS. 18A and 18B illustrate cross-sectional structures of the transistors used for the calculation. The transistors illustrated in FIGS. 18A and 18B each include a semiconductor region 953a and a semiconductor region 953c which have n⁺-type conductivity in an oxide semiconductor layer. The resistivities of the semiconductor region 953a and the semiconductor region 953c are $2 \times 10^{-3}$ Ωcm.

The transistor illustrated in FIG. 18A is formed over a base insulating layer 951 and an embedded insulator 952 which is embedded in the base insulating layer 951 and formed of aluminum oxide. The transistor includes the semiconductor region 953a, the semiconductor region 953c, an intrinsic semiconductor region 953b serving as a channel formation region therebetween, and a gate 955. The width of the gate 955 is 33 nm.

A gate insulating layer 954 is formed between the gate 955 and the semiconductor region 953b. In addition, a sidewall insulating layer 956a and a sidewall insulating layer 956b are formed on both side surfaces of the gate 955, and an insulator 957 is formed over the gate 955 so as to prevent a short circuit between the gate 955 and another wiring. The sidewall insulating layer has a width of 5 nm. A source 958a and a drain 958b are provided in contact with the semiconductor region 953a and the semiconductor region 953c, respectively. Note that the channel width of this transistor is 40 nm.

The transistor of FIG. 18B is the same as the transistor of FIG. 18A in that it is formed over the base insulating layer 951 and the embedded insulator 952 formed of aluminum oxide and that it includes the semiconductor region 953a, the semiconductor region 953c, the intrinsic semiconductor region 953b provided therebetween, the gate 955 having a width of 33 nm, the gate insulating layer 954, the sidewall insulating layer 956a, the sidewall insulating layer 956b, the insulator 957, the source 958a, and the drain 958b.

The transistor illustrated in FIG. 18A is different from the transistor illustrated in FIG. 18B in the conductivity type of semiconductor regions under the sidewall insulating layer 956a and the sidewall insulating layer 956b. In the transistor illustrated in FIG. 18A, the semiconductor regions under the sidewall insulating layer 956a and the sidewall insulating layer 956b are part of the semiconductor region 953a having n⁺-type conductivity and part of the semiconductor region 953c having n⁺-type conductivity, whereas in the transistor illustrated in FIG. 18B, the semiconductor regions under the sidewall insulating layer 956a and the sidewall insulating layer 956b are part of the intrinsic semiconductor region 953b. In other words, in the semiconductor layer of FIG. 18B, a region having a width of $L_{off}$ which overlaps with neither the semiconductor region 953a (the semiconductor region 953c) nor the gate 955 is provided. This region is called an offset region, and the width $L_{off}$ is called an offset length. As is seen from the drawing, the offset length is equal to the width of the sidewall insulating layer 956a (the sidewall insulating layer 956b).

Figure 15A:
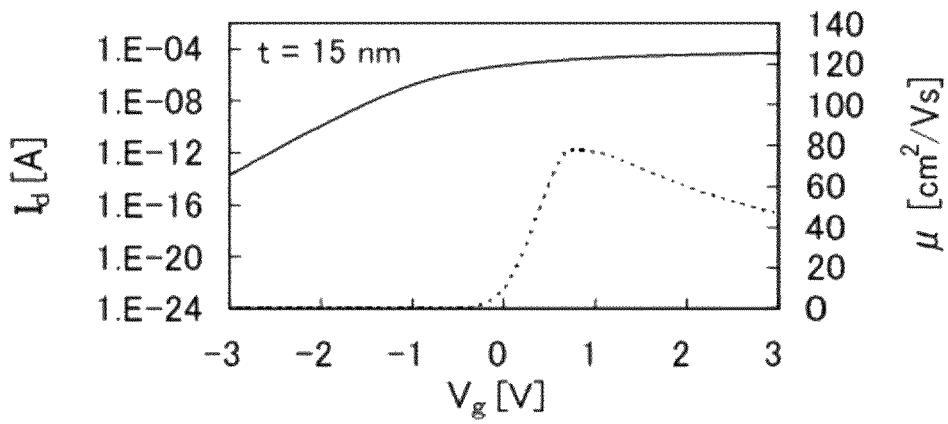
FIGS. 15A to 15C show the gate voltage dependence of drain current and mobility obtained by calculation.
Figure 15B:
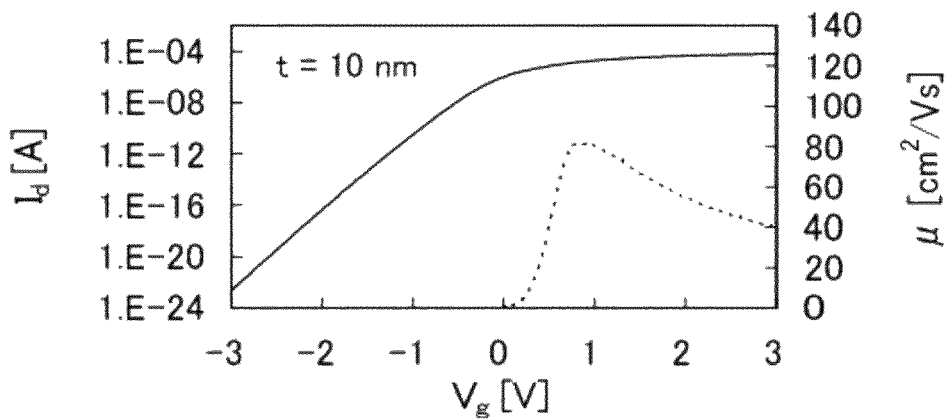
Figure 15C:
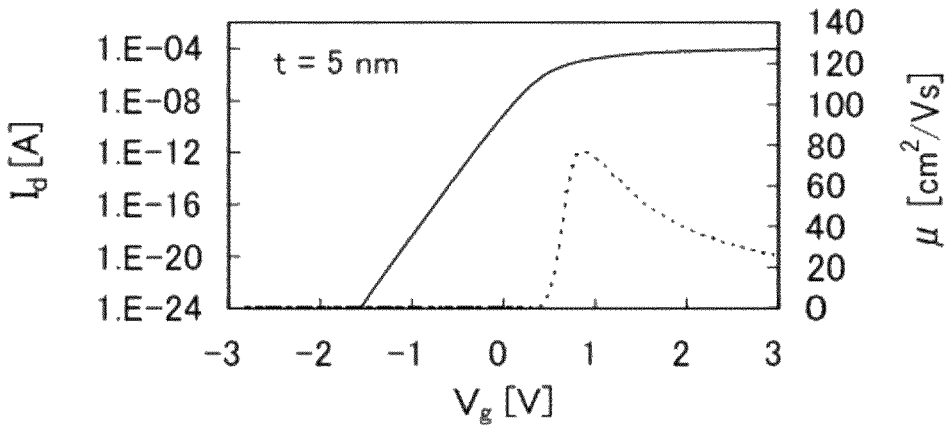

The other parameters used in calculation are as described above. For the calculation, device simulation software Sentaurus Device manufactured by Synopsys, Inc. was used. FIGS. 15A to 15C show the gate voltage ($V_g$: a potential difference between the gate and the source) dependence of the drain current ($I_d$, a solid line) and the mobility (μ, a dotted line) of the transistor having the structure illustrated in FIG. 18A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 15A shows the gate voltage dependence of the transistor in the case where the thickness of the gate insulating layer is 15 nm, FIG. 15B shows that of the transistor in the case where the thickness of the gate insulating layer is 10 nm, and FIG. 15C shows that of the transistor in the case where the thickness of the gate insulating layer is 5 nm. As the gate insulating layer is thinner, the drain current $I_d$ (off-state current) particularly in an off state is significantly decreased. In contrast, there is no noticeable change in the peak value of the mobility μ and the drain current $I_d$ in an on state (on-state current). The graphs show that the drain current exceeds 10 μA, which is required in a memory element and the like, at a gate voltage of around 1 V.

Figure 16A:
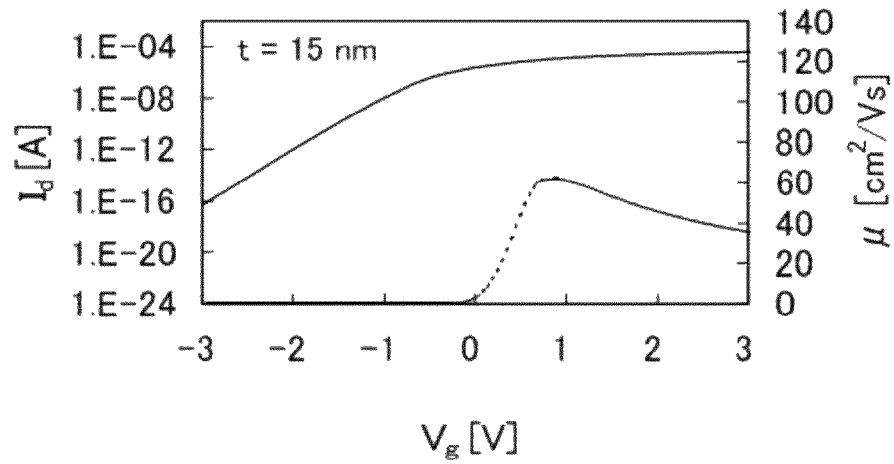
FIGS. 16A to 16C show the gate voltage dependence of drain current and mobility obtained by calculation.
Figure 16B:
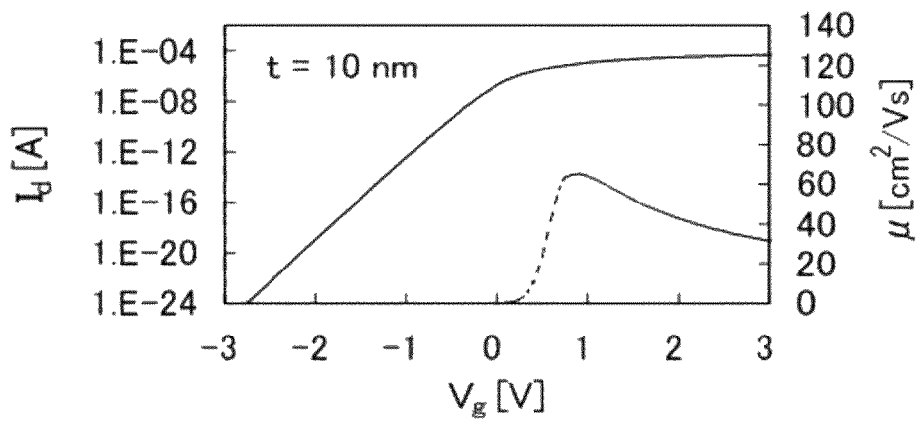
Figure 16C:
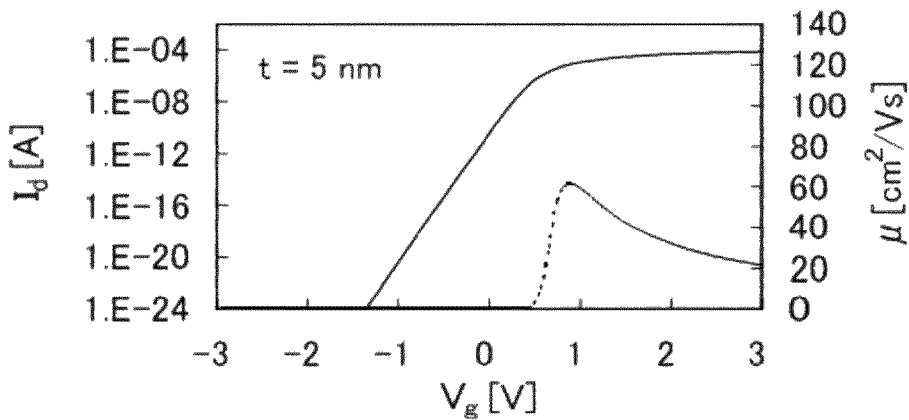

FIGS. 16A to 16C show the gate voltage $V_g$ dependence of the drain current $I_d$ (a solid line) and the mobility μ (a dotted line) of the transistor having the structure illustrated in FIG. 18B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 16A shows the gate voltage dependence of the transistor in the case where the thickness of the gate insulating layer is 15 nm, FIG. 16B shows that of the transistor in the case where the thickness of the gate insulating layer is 10 nm, and FIG. 16C shows that of the transistor in the case where the thickness of the gate insulating layer is 5 nm.

Figure 17A:
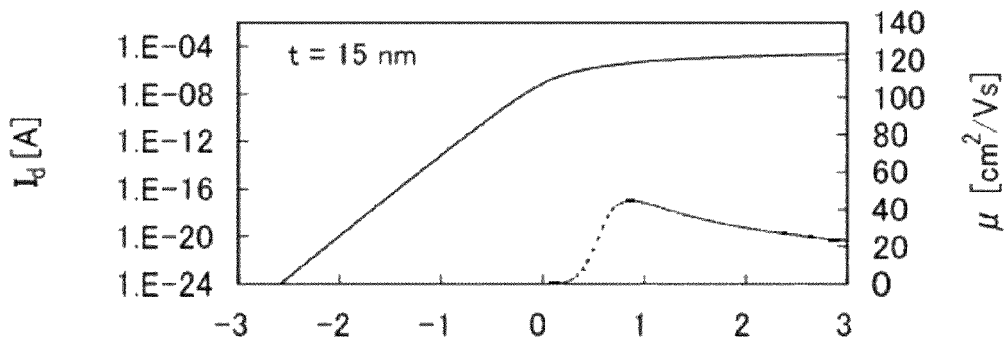
FIGS. 17A to 17C show the gate voltage dependence of drain current and mobility obtained by calculation.
Figure 17B:
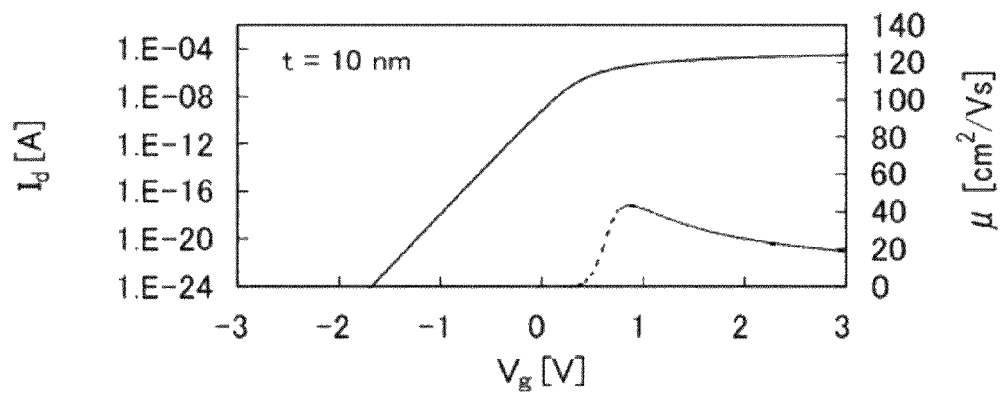
Figure 17C:
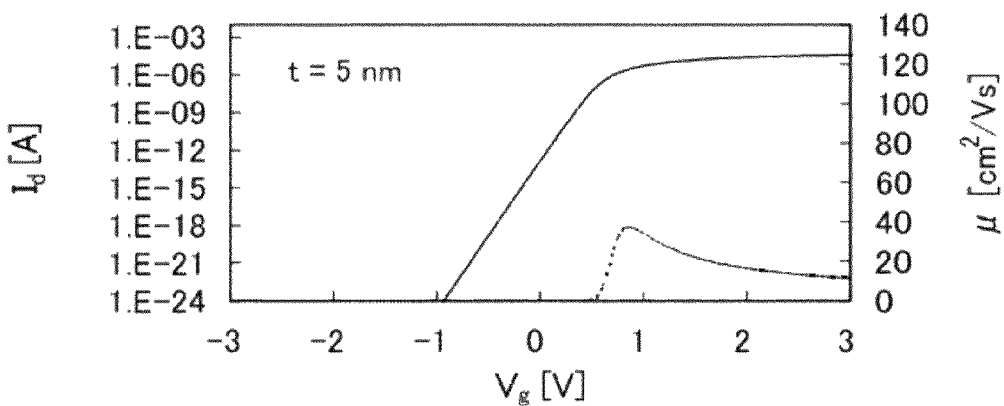
Figure 18A:
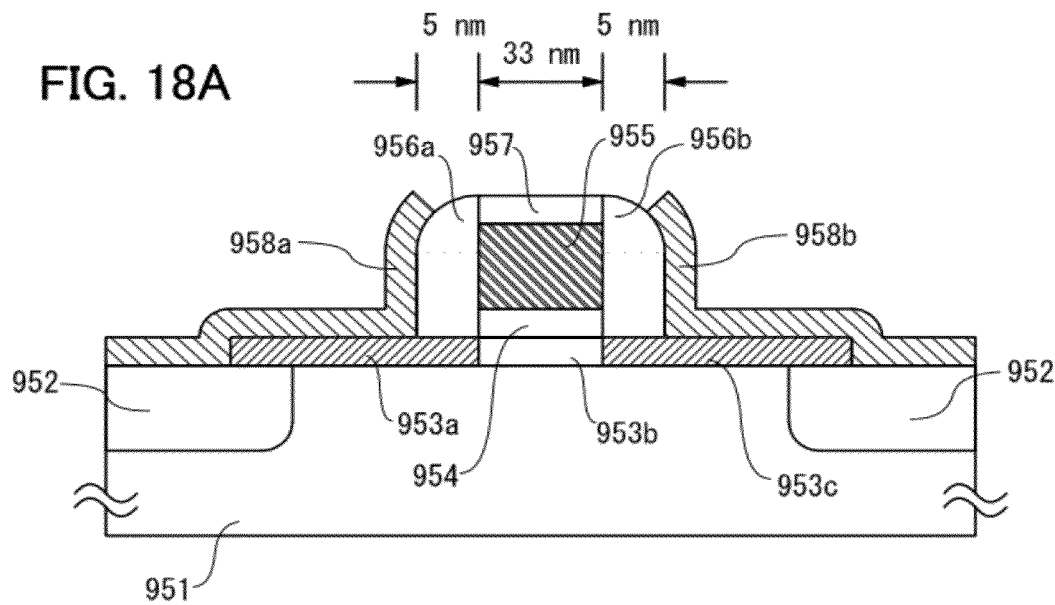
FIGS. 18A and 18B illustrate cross-sectional structures of transistors which are used in calculation.
Figure 18B:
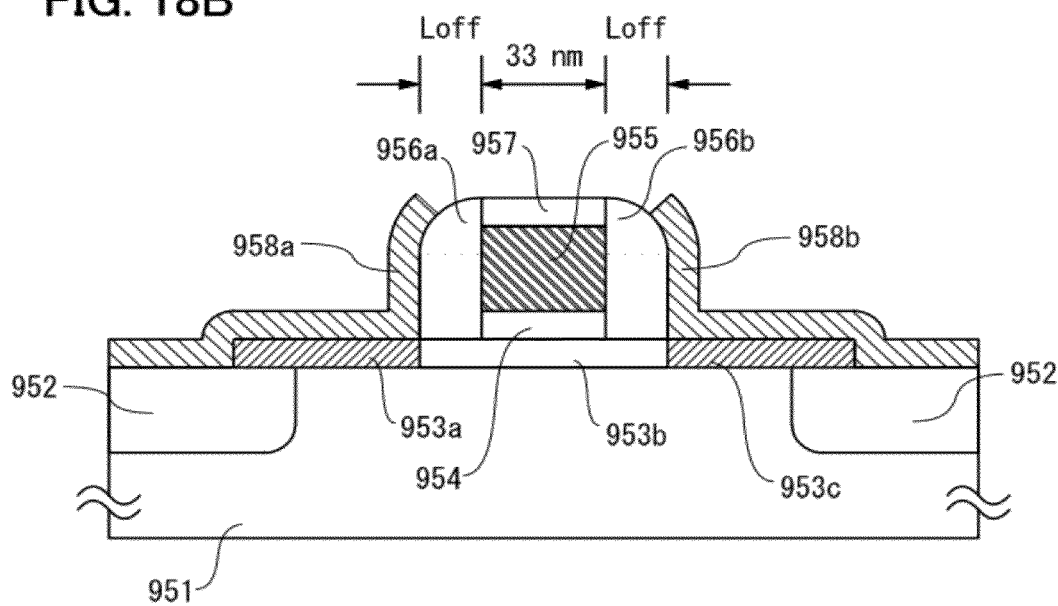

Further, FIGS. 17A to 17C show the gate voltage dependence of the drain current $I_d$ (a solid line) and the mobility μ (a dotted line) of the transistor having the structure illustrated in FIG. 18B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 17A shows the gate voltage dependence of the transistor in the case where the thickness of the gate insulating layer is 15 nm, FIG. 17B shows that of the transistor in the case where the thickness of the gate insulating layer is 10 nm, and FIG. 17C shows that of the transistor in the case where the thickness of the gate insulating layer is 5 nm.

In either of the structures, as the gate insulating layer is thinner, the off-state current is significantly decreased, whereas no noticeable change arises in the peak value of the mobility μ and the on-state current.

Note that the peak of the mobility μ is approximately 80 cm²/Vs in FIGS. 15A to 15C, approximately 60 cm²/Vs in FIGS. 16A to 16C, and approximately 40 cm²/Vs in FIGS. 17A to 17C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

A transistor in which an oxide semiconductor including In, Sn, and Zn as main components is used as a channel formation region can have favorable characteristics by depositing the oxide semiconductor while heating a substrate or by performing heat treatment after an oxide semiconductor layer is formed. Note that a main component refers to an element included in a composition at 5 atomic % or more.

By intentionally heating the substrate after formation of the oxide semiconductor layer including In, Sn, and Zn as main components, the field-effect mobility of the transistor can be improved. Further, the threshold voltage of the transistor can be positively shifted to make the transistor normally off.

Figure 19A:
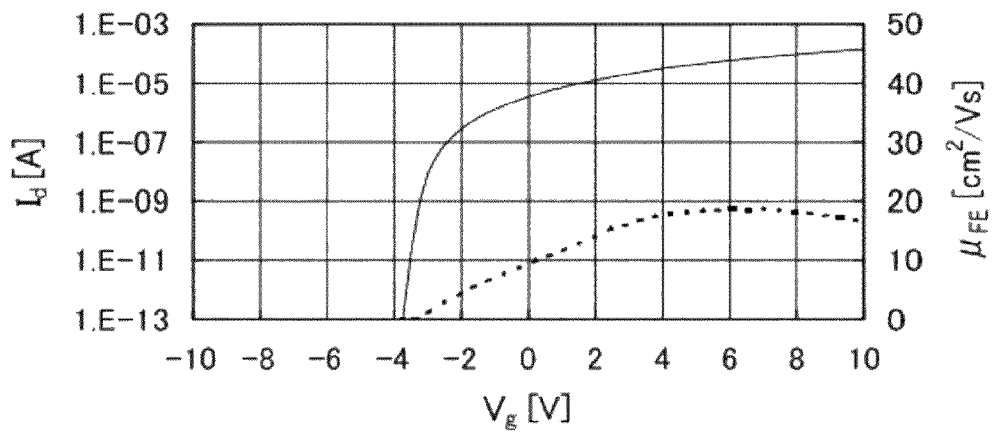
FIGS. 19A to 19C show characteristics of transistors.
Figure 19B:
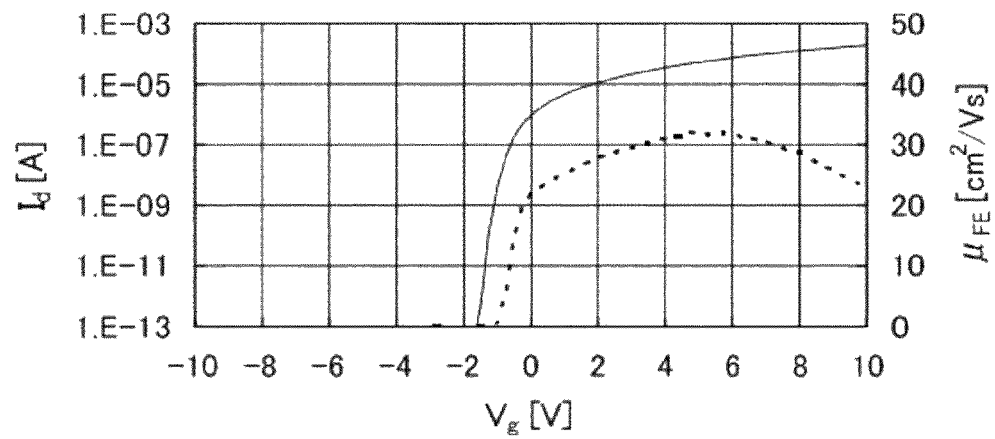
Figure 19C:
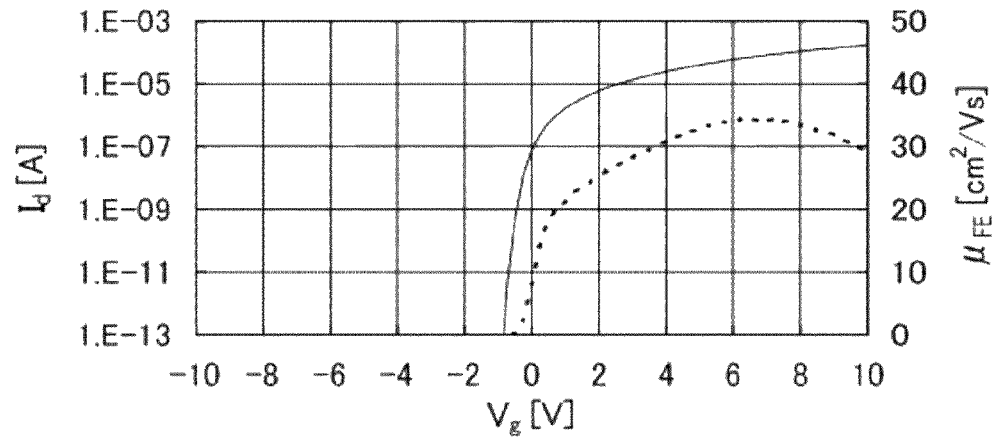

As an example, FIGS. 19A to 19C each show characteristics of a transistor in which an oxide semiconductor layer including In, Sn, and Zn as main components and having a channel length L of 3 μm and a channel width W of 10 μm, and a gate insulating layer with a thickness of 100 nm are used. Note that $V_d$ was set to 10 V.

FIG. 19A shows characteristics of a transistor whose oxide semiconductor layer including In, Sn, and Zn as main components was formed by a sputtering method without heating a substrate intentionally. The field-effect mobility of the transistor is 18.8 cm$^2$/Vsec. On the other hand, when the oxide semiconductor layer including In, Sn, and Zn as main components is formed while heating the substrate intentionally, the field-effect mobility can be improved. FIG. 19B shows characteristics of a transistor whose oxide semiconductor layer including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor layer including In, Sn, and Zn as main components. FIG. 19C shows characteristics of a transistor whose oxide semiconductor layer including In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor layer during the formation by sputtering. Further, the heat treatment after film formation enables hydrogen, a hydroxyl group, or moisture to be released and removed from the oxide semiconductor layer. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being purified by removal of impurities from the oxide semiconductor. In the case of using such a purified non-single-crystal oxide semiconductor, ideally, a field-effect mobility exceeding 100 cm$^2$/Vsec is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor layer that includes In, Sn, and Zn as main components and is formed without heating a substrate intentionally is used as a channel formation region, the threshold voltage tends to be shifted negatively. However, when the oxide semiconductor layer formed while heating the substrate intentionally is used, the problem of the negative shift of the threshold voltage can be solved. That is, the threshold voltage is shifted so that the transistor becomes normally off; this tendency can be confirmed by comparison between FIGS. 19A and 19B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor layer having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor layer, and Sample 2 on which heat treatment at 650° C. was performed after formation of an oxide semiconductor layer.

First, $V_g$-$I_d$ characteristics of the transistors were measured at a substrate temperature of 25° C. and $V_{ds}$ of 10 V. Note that $V_{ds}$ refers to a drain voltage (a potential difference between a drain and a source). Then, the substrate temperature was set to 150° C. and $V_{ds}$ was set to 0.1 V. After that, 20 V of $V_g$ was applied so that the intensity of an electric field applied to gate insulating layers was 2 MV/cm, and the condition was kept for one hour. Next, $V_g$ was set to 0 V. Then, $V_g$-$I_d$ characteristics of the transistors were measured at a substrate temperature of 25° C. and $V_{ds}$ of 10 V. This process is called a positive BT test.

In a similar manner, first, $V_g$-$I_d$ characteristics of the transistors were measured at a substrate temperature of 25° C. and $V_{ds}$ of 10 V. Then, the substrate temperature was set at 150° C. and $V_{ds}$ was set to 0.1 V. After that, −20 V of $V_g$ was applied so that the intensity of an electric field applied to the gate insulating layers was −2 MV/cm, and the condition was kept for one hour. Next, $V_g$ was set to 0 V. Then, $V_g$-$I_d$ characteristics of the transistors were measured at a substrate temperature of 25° C. and $V_{ds}$ of 10 V. This process is called a negative BT test.

Figure 20A:
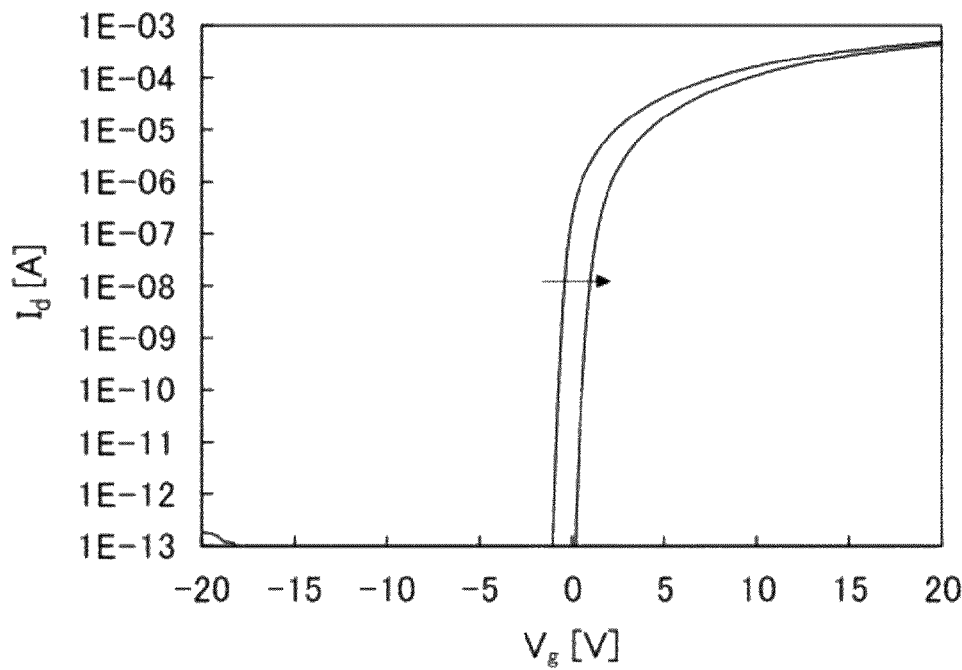
FIGS. 20A and 20B show $V_g$-$I_d$ characteristics after a BT test of a transistor of Sample 1.
Figure 20B:
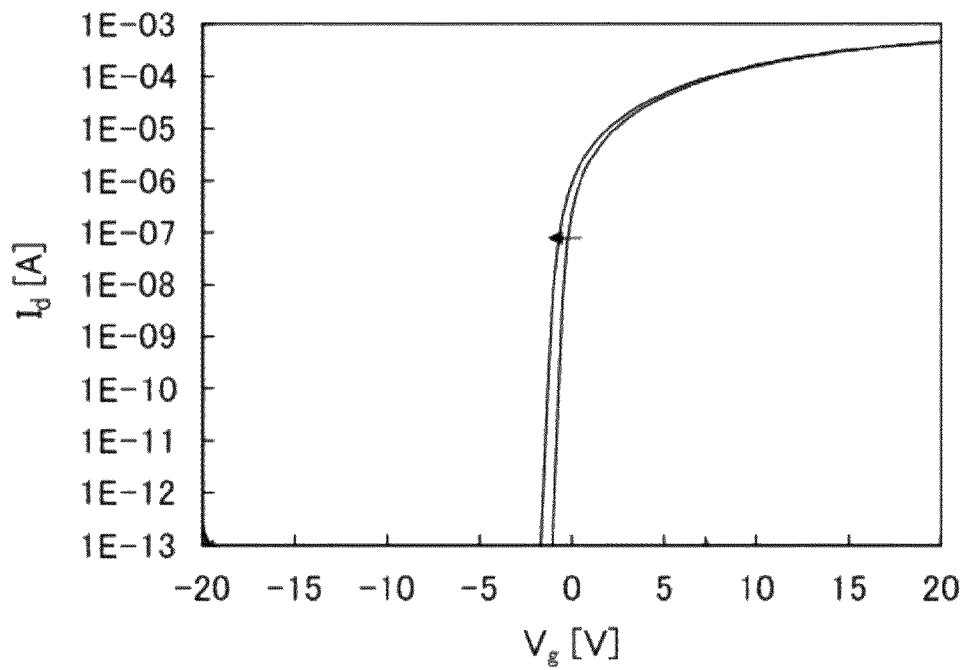
Figure 21A:
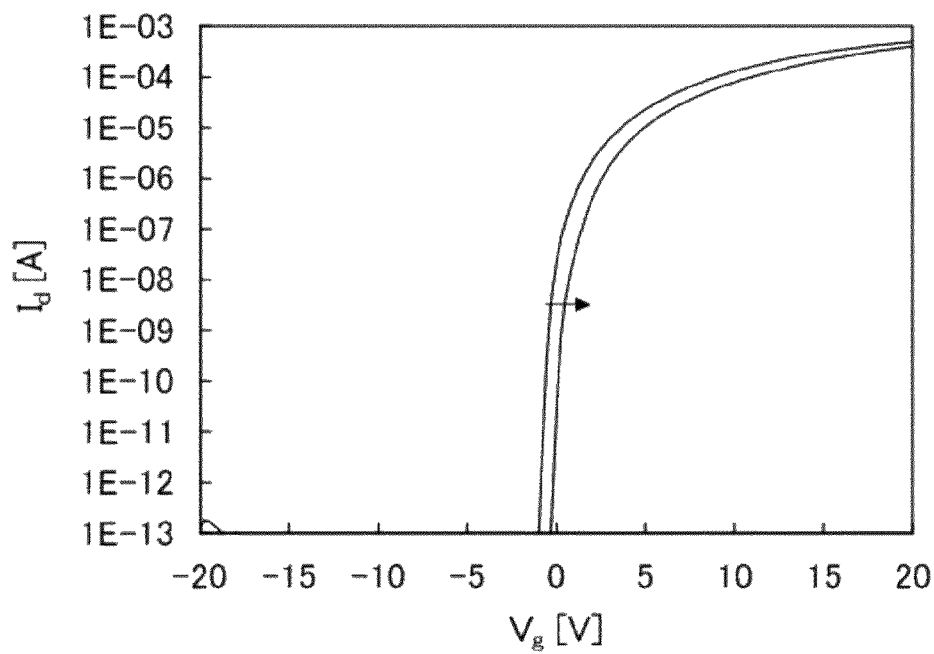
FIGS. 21A and 21B show $V_g$-$I_d$ characteristics after a BT test of a transistor of Sample 2.
Figure 21B:
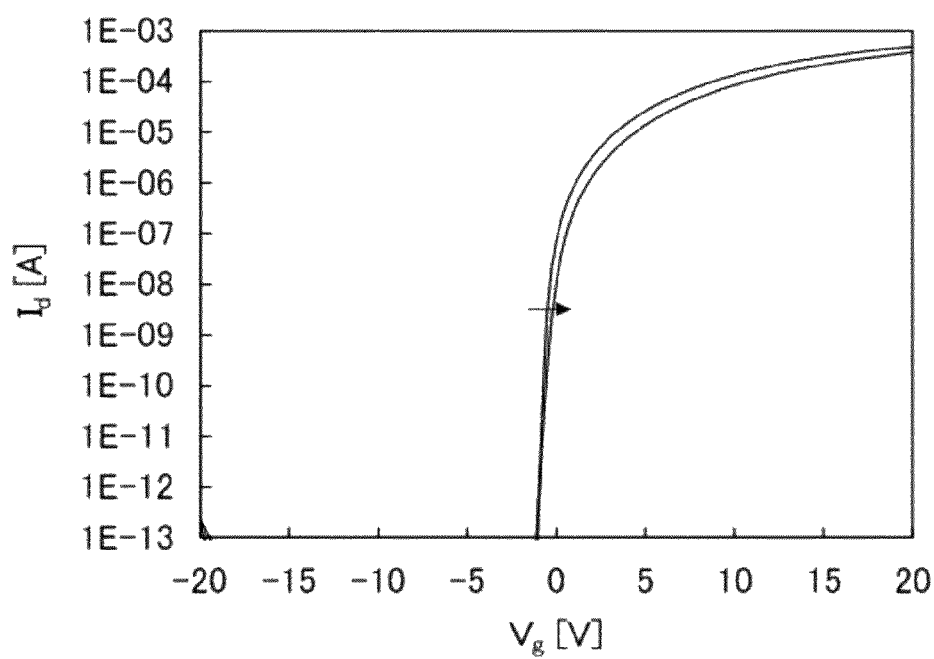

FIGS. 20A and 20B show a result of the positive BT test of Sample 1 and a result of the negative BT test of Sample 1, respectively. FIGS. 21A and 21B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor layer may be employed.

A defect due to oxygen deficiency is easily caused in the oxide semiconductor or at an interface between the oxide semiconductor and a film in contact with the oxide semiconductor; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1 \times 10^{16}/cm^3$ and lower than or equal to $2 \times 10^{20}/cm^3$, excess oxygen can be included in the oxide semiconductor without causing crystal distortion or the like.

When heat treatment is performed so that at least part of the oxide semiconductor includes crystal, a more stable oxide semiconductor layer can be obtained. For example, when an oxide semiconductor layer which is formed by sputtering using a target having a composition ratio of In:Sn:Zn=1:1:1 without heating a substrate intentionally is analyzed by X-ray diffraction (XRD), a halo pattern is observed. The formed oxide semiconductor layer can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 22:
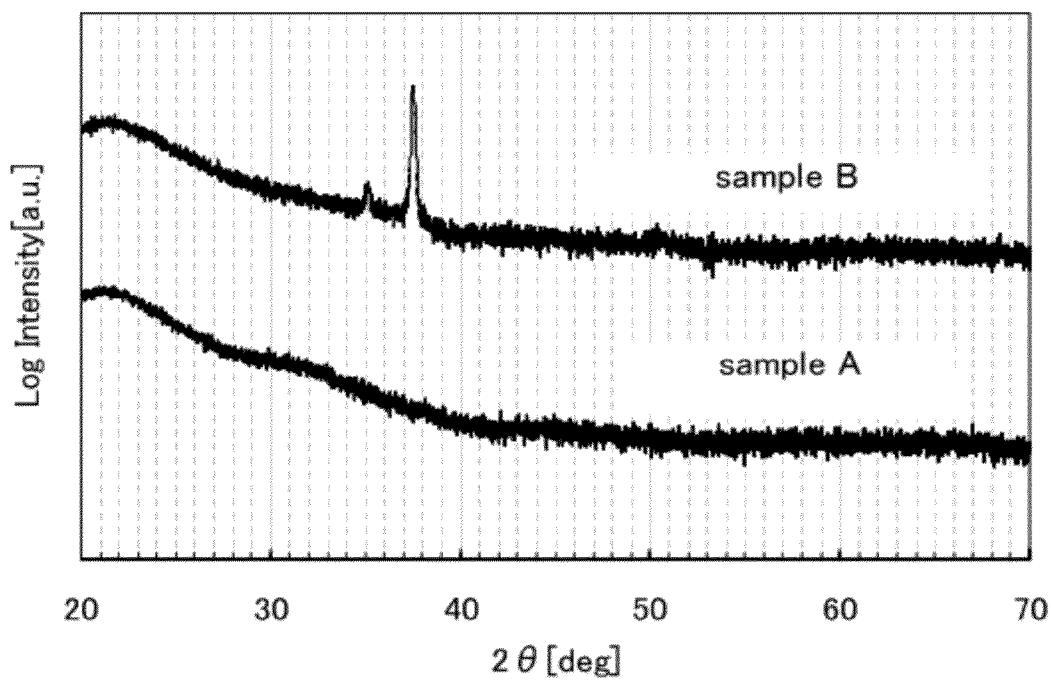
FIG. 22 shows XRD spectra.

FIG. 22 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The purification of an oxide semiconductor enables the off-state current of the transistor to be 1 aA/μm or lower. Here, the unit of the off-state current is used to indicate current per micrometer of a channel width.

Figure 23:
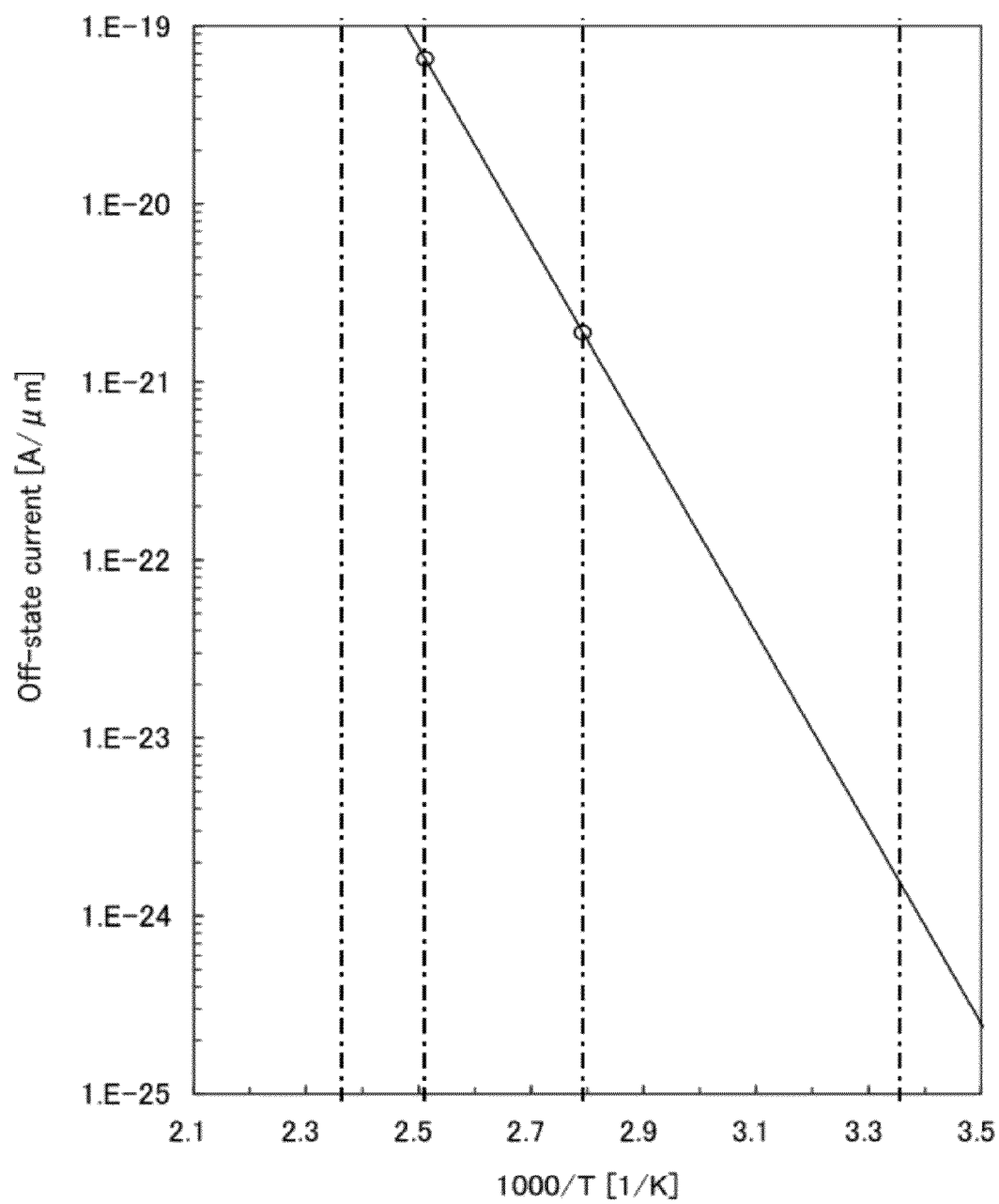
FIG. 23 shows the off-state current of a transistor.

FIG. 23 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 23, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and room temperature (27° C.), respectively. Preferably, the off-state current can be 0.1 aA/μm ($1 \times 10^{-19}$ A/μm) or lower, 10 zA/μm ($1 \times 10^{-20}$ A/μm) or lower, and 0.1 zA/μm ($1 \times 10^{-22}$ A/μm) or lower at 125° C., 85° C., and room temperature, respectively.

Note that in order to prevent hydrogen and moisture from being included in the oxide semiconductor layer during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor formed using Sample B, on which heat treatment at 650° C. was performed after formation of the oxide semiconductor layer, was evaluated.

The transistor used for the measurement has a channel length L of 3 μm, a channel width W of 10 μm, Lov of 0 μm, and dW of 0 μm. Note that $V_{ds}$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor layer, is referred to as dW.

Figure 24:
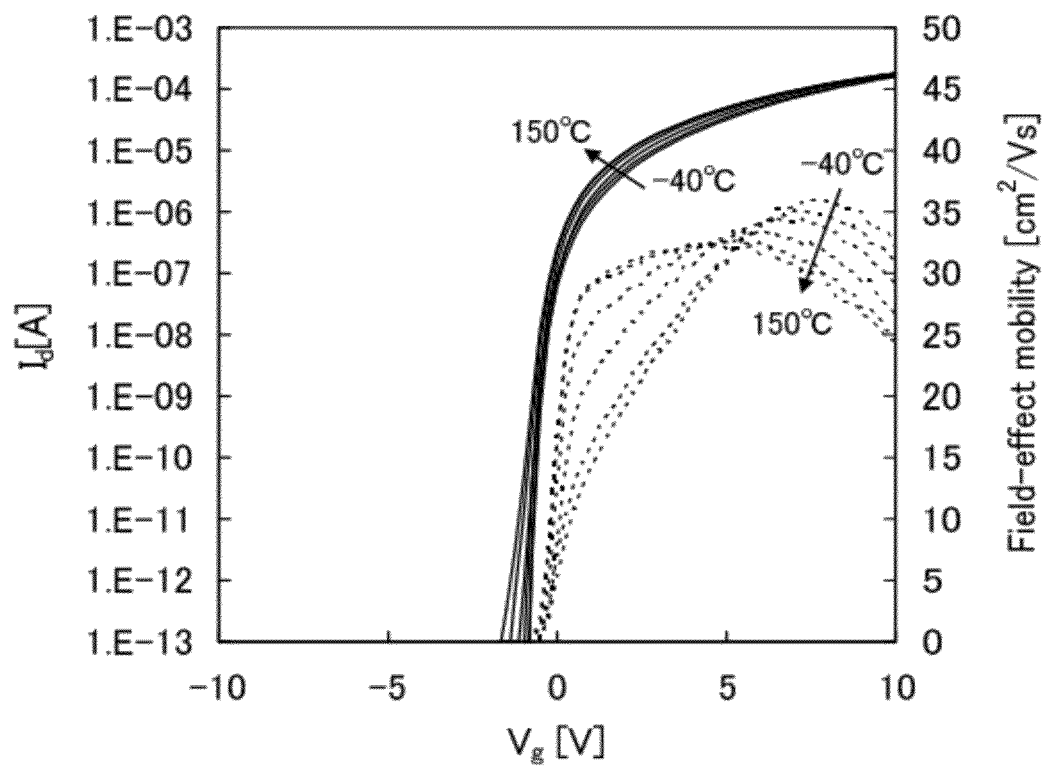
FIG. 24 shows $V_g$ dependence of $I_d$ (a solid line) and field-effect mobility (a dotted line)
Figure 25A:
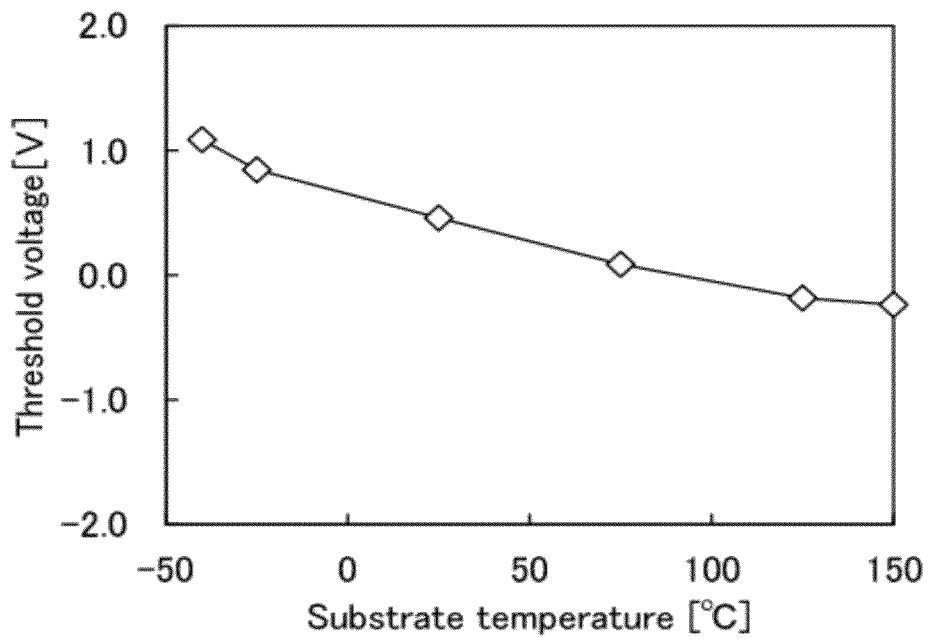
FIG. 25A shows a relation between substrate temperature and threshold voltage and FIG. 25B shows a relation between substrate temperature and field-effect mobility.

FIG. 24 shows the $V_g$ dependence of $I_d$ (a solid line) and field-effect mobility (a dotted line). FIG. 25A shows a relation between the substrate temperature and the threshold voltage, and FIG. 25B shows a relation between the substrate temperature and the field-effect mobility.

From FIG. 25A, it is found that the threshold voltage gets lower as the substrate temperature increases. Note that the threshold voltage is decreased from 1.09 V to −0.23 V in the range from −40° C. to 150° C.

Figure 25B:
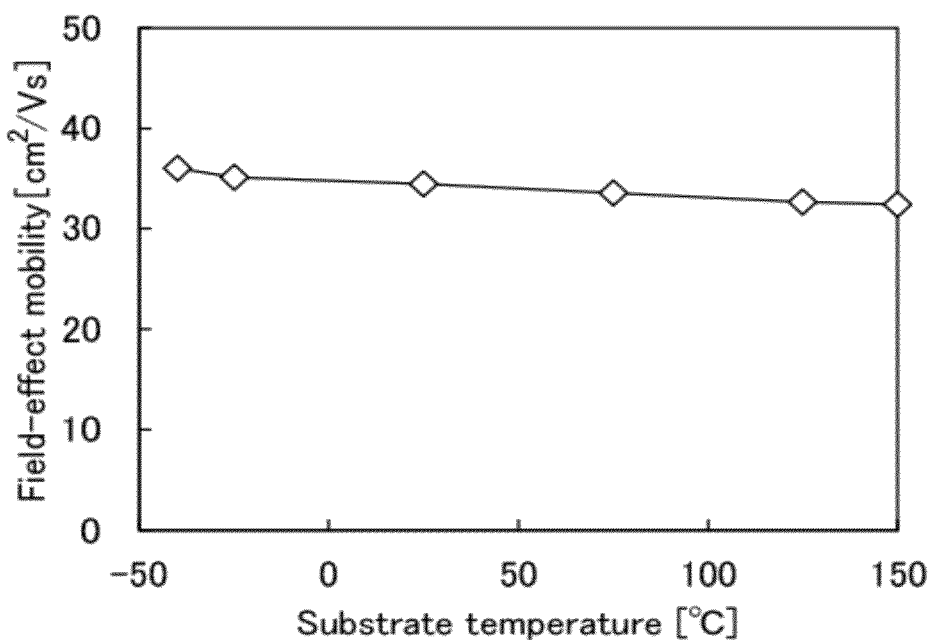

From FIG. 25B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm$^2$/Vsec or higher, preferably 40 cm$^2$/Vsec or higher, further preferably 60 cm$^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

The configurations, methods, and the like described in this embodiment can be combined as appropriate with any of the configurations, methods, and the like described in the other embodiments.

Embodiment 4

In this embodiment, an example of a transistor in which an In—Sn—Zn—O film is used as an oxide semiconductor layer will be described with reference to FIGS. 26A and 26B and the like.

Figure 26A:
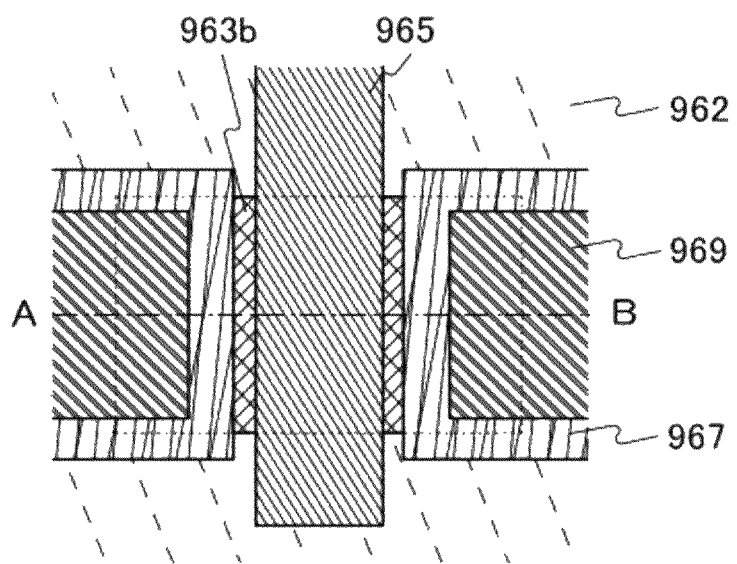
FIGS. 26A and 26B illustrate a structure of a transistor.
Figure 26B:
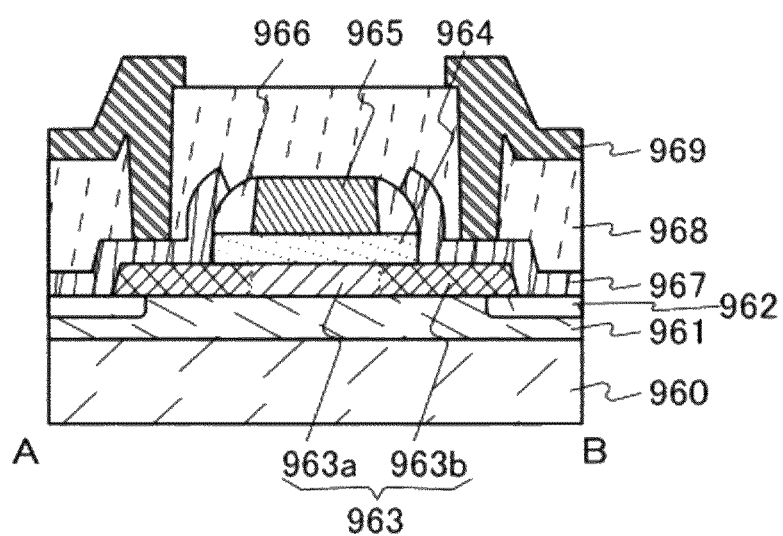

FIGS. 26A and 26B are a top view and a cross-sectional view of a coplanar transistor having a top-gate top-contact structure. FIG. 26A is the top view of the transistor. FIG. 26B illustrates cross section A-B along dashed-dotted line A-B in FIG. 26A.

The transistor illustrated in FIG. 26B includes a substrate 960; a base insulating layer 961 provided over the substrate 960; a protective insulating film 962 provided in the periphery of the base insulating layer 961; an oxide semiconductor layer 963 provided over the base insulating layer 961 and the protective insulating film 962 and including a high-resistance region 963a and low-resistance regions 963b; a gate insulating layer 964 provided over the oxide semiconductor layer 963; a gate electrode 965 provided to overlap with the oxide semiconductor layer 963 with the gate insulating layer 964 positioned therebetween; a sidewall insulating film 966 provided in contact with a side surface of the gate electrode 965; a pair of electrodes 967 provided in contact with at least the low-resistance regions 963b; an interlayer insulating layer 968 provided to cover at least the oxide semiconductor layer 963, the gate electrode 965, and the pair of electrodes 967; and a wiring 969 provided to be connected to at least one of the pair of electrodes 967 through an opening formed in the interlayer insulating layer 968.

Although not illustrated, a protective film may be provided to cover the interlayer insulating layer 968 and the wiring 969. With the protective film, a minute amount of leakage current generated by surface conduction of the interlayer insulating layer 968 can be reduced and thus the off-state current of the transistor can be reduced.

The transistor of this embodiment can be combined as appropriate with any of the configurations, methods, and the like described in the other embodiments.

Embodiment 5

In this embodiment, another example of a transistor in which an In—Sn—Zn—O film is used as an oxide semiconductor layer will be described.

Figure 27A:
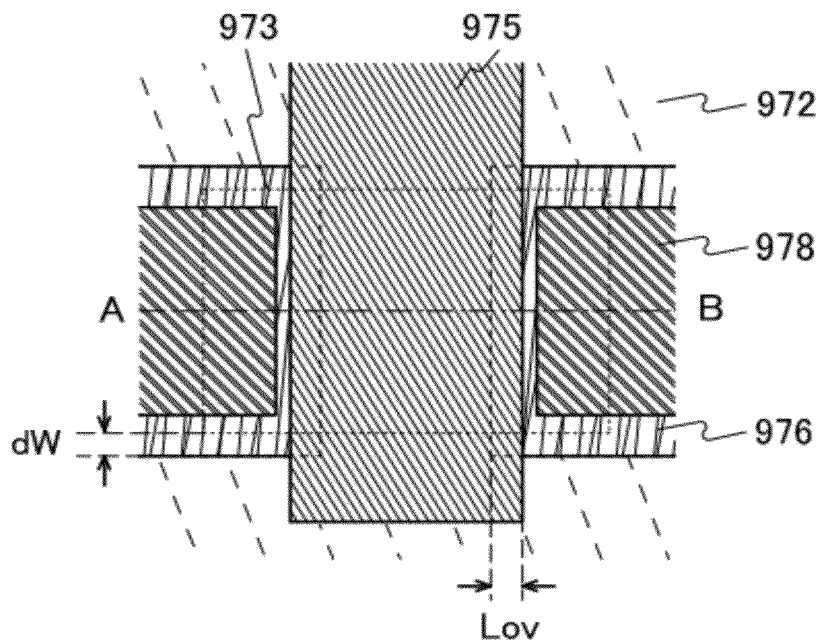
FIGS. 27A and 27B illustrate a structure of a transistor.
Figure 27B:
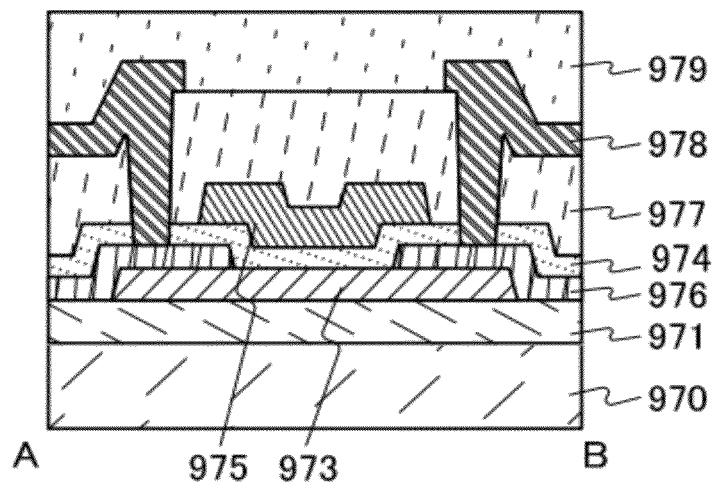

FIGS. 27A and 27B are a top view and a cross-sectional view which illustrate a structure of a transistor manufactured in this embodiment. FIG. 27A is the top view of the transistor. FIG. 27B is a cross-sectional view along dashed-dotted line A-B in FIG. 27A.

The transistor illustrated in FIG. 27B includes a substrate 970; a base insulating layer 971 provided over the substrate 970; an oxide semiconductor layer 973 provided over the base insulating layer 971; a pair of electrodes 976 in contact with the oxide semiconductor layer 973; a gate insulating layer 974 provided over the oxide semiconductor layer 973 and the pair of electrodes 976; a gate electrode 975 provided to overlap with the oxide semiconductor layer 973 with the gate insulating layer 974 positioned therebetween; an interlayer insulating layer 977 provided to cover the gate insulating layer 974 and the gate electrode 975; wirings 978 connected to the pair of electrodes 976 through openings formed in the interlayer insulating layer 977; and a protective film 979 provided to cover the interlayer insulating layer 977 and the wirings 978.

As the substrate 970, a glass substrate can be used. As the base insulating layer 971, a silicon oxide film can be used. As the oxide semiconductor layer 973, an In—Sn—Zn—O film can be used. As the pair of electrodes 976, a tungsten film can be used. As the gate insulating layer 974, a silicon oxide film can be used. The gate electrode 975 can have a stacked structure of a tantalum nitride film and a tungsten film. The interlayer insulating layer 977 can have a stacked structure of a silicon oxynitride film and a polyimide film. The wirings 978 can each have a stacked structure in which a titanium film, an aluminum film, and a titanium film are formed in this order. As the protective film 979, a polyimide film can be used.

Note that in the transistor having the structure illustrated in FIG. 27A, the width of a portion where the gate electrode 975 overlaps with one of the pair of electrodes 976 is referred to as Lov. Similarly, the width of a portion of the pair of electrodes 976, which does not overlap with the oxide semiconductor layer 973, is referred to as dW.

The transistor of this embodiment can be combined as appropriate with any of the configurations, methods, and the like described in the other embodiments.

Embodiment 6

In this embodiment, the case where the semiconductor device described in the above embodiment is applied to an electronic device will be described with reference to FIGS. 10A to 10F. In this embodiment, examples of the electronic device to which the above semiconductor device is applied include a computer, a mobile phone (also referred to as a cellular phone or a mobile phone device), a personal digital assistant (including a portable game machine, an audio reproducing device, and the like), a camera such as a digital camera or a digital video camera, electronic paper, and a television device (also referred to as a television or a television receiver).

Figure 10A:
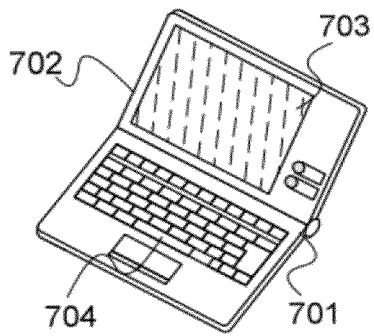
FIGS. 10A to 10F each illustrate an electronic device including a semiconductor device.

FIG. 10A illustrates a laptop personal computer that includes a housing 701, a housing 702, a display portion 703, a keyboard 704, and the like. The semiconductor device described in any of the above embodiments is provided in at least one of the housing 701 and the housing 702. Therefore, a laptop personal computer in which writing and reading of data are performed at high speed, data is stored for a long time, and power consumption is sufficiently reduced can be realized.

Figure 10B:
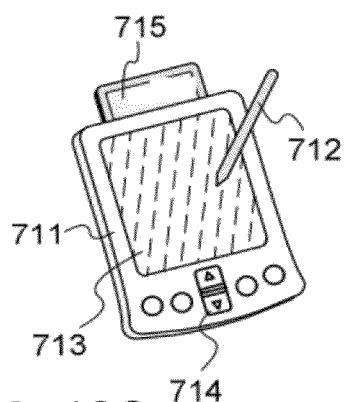
Figure 10C:
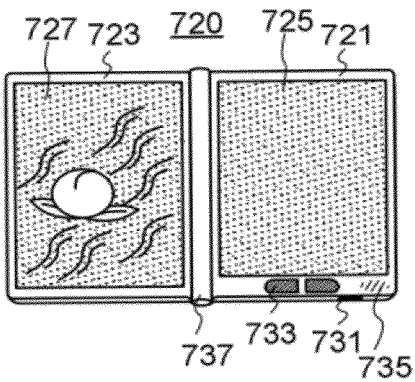

FIG. 10B illustrates a personal digital assistant (PDA). A main body 711 is provided with a display portion 713, an external interface 715, operation buttons 714, and the like. Therefore, a personal digital assistant in which writing and reading of data are performed at high speed, data is stored for a long time, and power consumption is sufficiently reduced can be realized.

FIG. 29C illustrates an e-book reader 720 on which electronic paper is mounted. The e-book reader 720 has two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power supply 731, an operation key 733, a speaker 735, and the like. At least one of the housings 721 and 723 is provided with the semiconductor device described in any of the above embodiments. Therefore, an e-book reader in which writing and reading of data are performed at high speed, data is stored for a long time, and power consumption is sufficiently reduced can be realized.

Figure 10D:
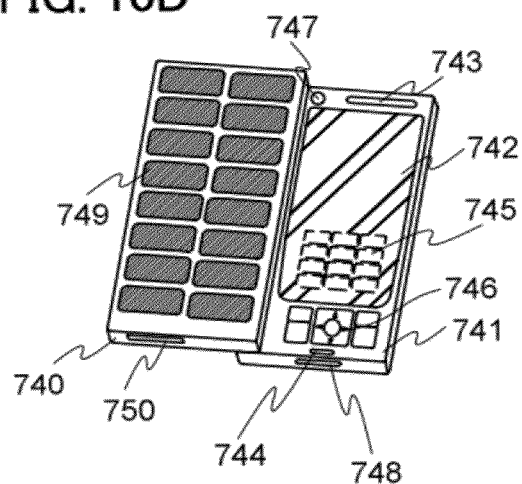

FIG. 10D illustrates a mobile phone which includes two housings, a housing 740 and a housing 741. Further, the housing 740 and the housing 741 in a state where they are developed as illustrated in FIG. 10D can shift by sliding so that one is lapped over the other; therefore, the size of the mobile phone can be reduced, which makes the mobile phone suitable for being carried. The housing 741 includes a display panel 742, a speaker 743, a microphone 744, an operation key 745, a pointing device 746, a camera 747, an external connection electrode 748, and the like. The housing 740 includes a solar cell 749 for charging the mobile phone, an external memory slot 750, and the like. In addition, an antenna is incorporated in the housing 741. At least one of the housings 740 and 741 is provided with the semiconductor device described in any of the above embodiments. Therefore, a mobile phone in which writing and reading of data are performed at high speed, data is stored for a long time, and power consumption is sufficiently reduced can be realized.

Figure 10E:
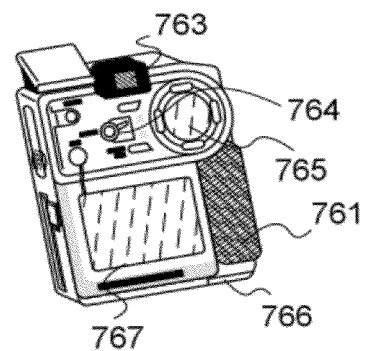

FIG. 10E illustrates a digital camera including a main body 761, a display portion 767, an eyepiece 763, an operation switch 764, a display portion 765, a battery 766, and the like. In the main body 761, the semiconductor device described in any of the above embodiments is provided. Therefore, a digital camera in which writing and reading of data are performed at high speed, data is stored for a long time, and power consumption is sufficiently reduced can be realized.

Figure 10F:
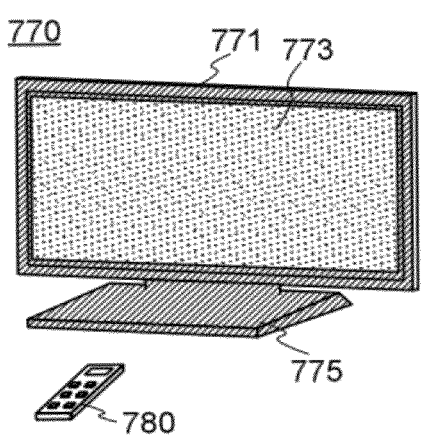

FIG. 10F illustrates a television device including a housing 771, a display portion 773, a stand 775, and the like. The television device 770 can be operated with an operation switch of the housing 771 or a remote controller 780. The semiconductor device described in any of the above embodiments is mounted on the housing 771 and the remote controller 780. Therefore, a television device in which writing and reading of data are performed at high speed, data is stored for a long time, and power consumption is sufficiently reduced can be realized.

As described above, the electronic devices described in this embodiment each include the semiconductor device according to the above embodiment. Therefore, electronic devices with low power consumption can be realized.

This application is based on Japanese Patent Application serial no. 2010-175275 filed with Japan Patent Office on Aug. 4, 2010 and Japanese Patent Application serial no. 2011-108155 filed with Japan Patent Office on May 13, 2011, the entire contents of which are hereby incorporated by reference.

What is claimed is:

1. A semiconductor device comprising:
   a source line;
   n bit lines, n being a natural number;
   m memory cells electrically connected in series between the source line and the bit lines, m being a natural number;
   m+1 word lines;
   a first selection line and a second selection line;
   a first selection transistor comprising a gate electrode electrically connected to the first selection line; and
   a second selection transistor comprising a gate electrode electrically connected to the second selection line;
   wherein the memory cells each comprises:
      a first transistor comprising a substrate including a semiconductor material, a first gate electrode, a first source electrode, and a first drain electrode;
      a second transistor comprising an oxide semiconductor layer, a second gate electrode, a second source electrode, and a second drain electrode; and
      a capacitor,
   wherein the source line is electrically connected to the first source electrode in a m-th memory cell through the second selection transistor,
   wherein a first bit line is electrically connected to the first drain electrode of a first memory cell through the first selection transistor and is electrically connected to the second drain electrode of the first memory cell,
   wherein a first word line is electrically connected to the second gate electrode of the first memory cell,
   wherein a k-th word line is electrically connected to the second gate electrode of a k-th memory cell and is electrically connected to one electrode of the capacitor in a (k−1)-th memory cell, k being a natural number of greater than or equal to 2 and less than or equal to m,
   wherein the first drain electrode of the k-th memory cell is electrically connected to the first source electrode of the (k−1)-th memory cell, and
   wherein the first gate electrode of the m-th memory cell, the second source electrode of the m-th memory cell, and the other electrode of the capacitor of the m-th memory cell are electrically connected to one other.

2. The semiconductor device according to claim 1, wherein the first transistor comprises:
   a channel formation region provided in the substrate including a semiconductor material;
   impurity regions between which the channel formation region is provided;
   a first gate insulating layer over the channel formation region; and
   the first gate electrode provided over the first gate insulating layer so as to overlap with the channel formation region.

3. The semiconductor device according to claim 1, wherein the second source electrode and the second drain electrode are electrically connected to the oxide semiconductor layer;
   wherein the second gate electrode overlaps with the oxide semiconductor layer, and wherein a second gate insulating layer is formed between the oxide semiconductor layer and the second gate electrode.

4. The semiconductor device according to claim 1, wherein the second transistor has a conductivity type different from a conductivity type of the first transistor.

5. The semiconductor device according to claim 4, wherein the second transistor is a p-channel transistor.

6. The semiconductor device according to claim 1, wherein the substrate including the semiconductor material is a single crystal semiconductor substrate or an SOI substrate.

7. The semiconductor device according to claim 1, wherein the semiconductor material is silicon.

8. The semiconductor device according to claim 1, wherein the oxide semiconductor layer includes an oxide semiconductor material including In, Ga and Zn or an oxide semiconductor material including In, Sn and Zn.

9. The semiconductor device according to claim 1, wherein buffer layers having n-type conductivity are formed between the second source electrode and the oxide semiconductor layer and between the second drain electrode and the oxide semiconductor layer.

10. The semiconductor device according to claim 1, wherein the oxide semiconductor includes an oxide including a crystal with c-axis alignment.

11. A semiconductor device comprising:
a source line;
n bit lines, n being a natural number;
m memory cells electrically connected in series between the source line and the bit lines, m being a natural number;
m+1 word lines;
a first selection line and a second selection line;
a first selection transistor comprising a gate electrode electrically connected to the first selection line; and
a second selection transistor comprising a gate electrode electrically connected to the second selection line;
wherein the memory cells each comprises:
a first transistor comprising a substrate including a semiconductor material, a first gate electrode, a first source electrode, and a first drain electrode;
a second transistor comprising an oxide semiconductor layer, a second gate electrode, a second source electrode, and a second drain electrode; and
a capacitor including the second source electrode, the oxide semiconductor, the second gate insulating layer, an insulating layer over the second gate insulating layer and an electrode over the insulating layer,
wherein the source line is electrically connected to the first source electrode in a m-th memory cell through the second selection transistor,
wherein a first bit line is electrically connected to the first drain electrode of a first memory cell through the first selection transistor and is electrically connected to the second drain electrode of the first memory cell,
wherein a first word line is electrically connected to the second gate electrode of the first memory cell,
wherein a k-th word line is electrically connected to the second gate electrode of a k-th memory cell and is electrically connected to one electrode of the capacitor in a (k−1)-th memory cell, k being a natural number of greater than or equal to 2 and less than or equal to m,
wherein the first drain electrode of the k-th memory cell is electrically connected to the first source electrode of the (k−1)-th memory cell, and
wherein the first gate electrode of the m-th memory cell, the second source electrode of the m-th memory cell, and the other electrode of the capacitor of the m-th memory cell are electrically connected to one other.

12. The semiconductor device according to claim 11, wherein the first transistor comprises:
a channel formation region provided in the substrate including a semiconductor material;
impurity regions between which the channel formation region is provided;
a first gate insulating layer over the channel formation region; and
the first gate electrode provided over the first gate insulating layer so as to overlap with the channel formation region.

13. The semiconductor device according to claim 11, wherein the second source electrode and the second drain electrode are electrically connected to the oxide semiconductor layer;
wherein the second gate electrode overlaps with the oxide semiconductor layer, and
wherein a second gate insulating layer is formed between the oxide semiconductor layer and the second gate electrode.

14. The semiconductor device according to claim 11, wherein the second transistor has a conductivity type different from a conductivity type of the first transistor.

15. The semiconductor device according to claim 14, wherein the second transistor is a p-channel transistor.

16. The semiconductor device according to claim 11, wherein the substrate including the semiconductor material is a single crystal semiconductor substrate or an SOI substrate.

17. The semiconductor device according to claim 11, wherein the semiconductor material is silicon.

18. The semiconductor device according to claim 11, wherein the oxide semiconductor layer includes an oxide semiconductor material including In, Ga and Zn or an oxide semiconductor material including In, Sn and Zn.

19. The semiconductor device according to claim 11, wherein buffer layers having n-type conductivity are formed between the second source electrode and the oxide semiconductor layer and between the second drain electrode and the oxide semiconductor layer.

20. The semiconductor device according to claim 11, wherein the oxide semiconductor includes an oxide including a crystal with c-axis alignment.

* * * * *

UNITED STATES PATENT AND TRADEMARK OFFICE
CERTIFICATE OF CORRECTION

PATENT NO. : 8,537,600 B2
APPLICATION NO. : 13/191934
DATED : September 17, 2013
INVENTOR(S) : Daisuke Matsubayashi Page 1 of 1

It is certified that error appears in the above-identified patent and that said Letters Patent is hereby corrected as shown below:

In the Specifications

At column 7, line 11, "$(<_{th\_L})$" should be --$(< V_{th\_L})$--;

At column 25, line 9, "tricoordinate 0" should be --tricoordinate O--;

At column 26, line 63, "$In_2SnZn_2O_7(ZnO)$," should be --$In_2SnZn_2O_7(ZnO)_m$--;

At column 39, line 25, "$2\times10^{2o}/cm^3$" should be --$2\times10^{20}/cm^3$--.

Signed and Sealed this
Eleventh Day of March, 2014

Michelle K. Lee
*Deputy Director of the United States Patent and Trademark Office*